(12) United States Patent
Uchikura et al.

(10) Patent No.: US 8,522,191 B2
(45) Date of Patent: Aug. 27, 2013

(54) AIDING DEVICE, AND NON-TRANSITORY COMPUTER-READABLE RECORDING MEDIUM IN WHICH DESIGN AIDING PROGRAM IS STORED

(75) Inventors: Youji Uchikura, Kawasaki (JP);
Akiyoshi Saitou, Kawasaki (JP);
Yukihiko Onishi, Kawasaki (JP);
Manabu Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 120 days.

(21) Appl. No.: 13/211,457

(22) Filed: Aug. 17, 2011

(65) Prior Publication Data

US 2012/0059499 A1  Mar. 8, 2012

(30) Foreign Application Priority Data

Sep. 2, 2010 (JP) .................................. 2010-196783

(51) Int. Cl.
*G06F 17/50* (2006.01)

(52) U.S. Cl.
USPC ....................................................... 716/137

(58) Field of Classification Search
USPC ....................................................... 716/137
See application file for complete search history.

(56) References Cited

U.S. PATENT DOCUMENTS

| 6,496,957 | B1 * | 12/2002 | Kumagai | 716/112 |
| 6,684,380 | B2 * | 1/2004 | Rubin et al. | 716/137 |
| 6,938,227 | B2 * | 8/2005 | Murphy et al. | 716/102 |
| 7,168,058 | B2 * | 1/2007 | Harada et al. | 716/112 |
| 8,286,124 | B2 * | 10/2012 | Sakata et al. | 716/137 |
| 8,340,803 | B2 * | 12/2012 | Chida et al. | 700/121 |
| 2002/0118229 | A1 | 8/2002 | Batori et al. | |
| 2002/0157067 | A1 * | 10/2002 | Yaguchi | 716/1 |
| 2008/0189080 | A1 | 8/2008 | Tenma et al. | |
| 2010/0005438 | A1 * | 1/2010 | Nakamura | 716/11 |

FOREIGN PATENT DOCUMENTS

| JP | 9-167172 | 6/1997 |
| JP | 9-311878 | 12/1997 |
| JP | 2002-324084 | 11/2002 |
| JP | 2008-84211 | 4/2008 |
| JP | 2009-116743 | 5/2009 |

* cited by examiner

*Primary Examiner* — Jack Chiang
*Assistant Examiner* — Brandon Bowers
(74) *Attorney, Agent, or Firm* — Staas & Halsey LLP

(57) ABSTRACT

The design aiding device includes a processor that creates assembled model data, representing an assembled model that assumes arrangement of the part on the board, on the basis of the board data and the part data stored in the first storing section and the second storing section, respectively. The processor includes a recognizing section that recognizes a mounting face of a part model defined by the part data, the mounting face being mounted on a board model defined by the board data; and an arrangement processing section that creates the assembled model data by arranging the part model on the board model on the basis of the mounting face recognized by the recognizing section.

15 Claims, 16 Drawing Sheets

FIG. 4
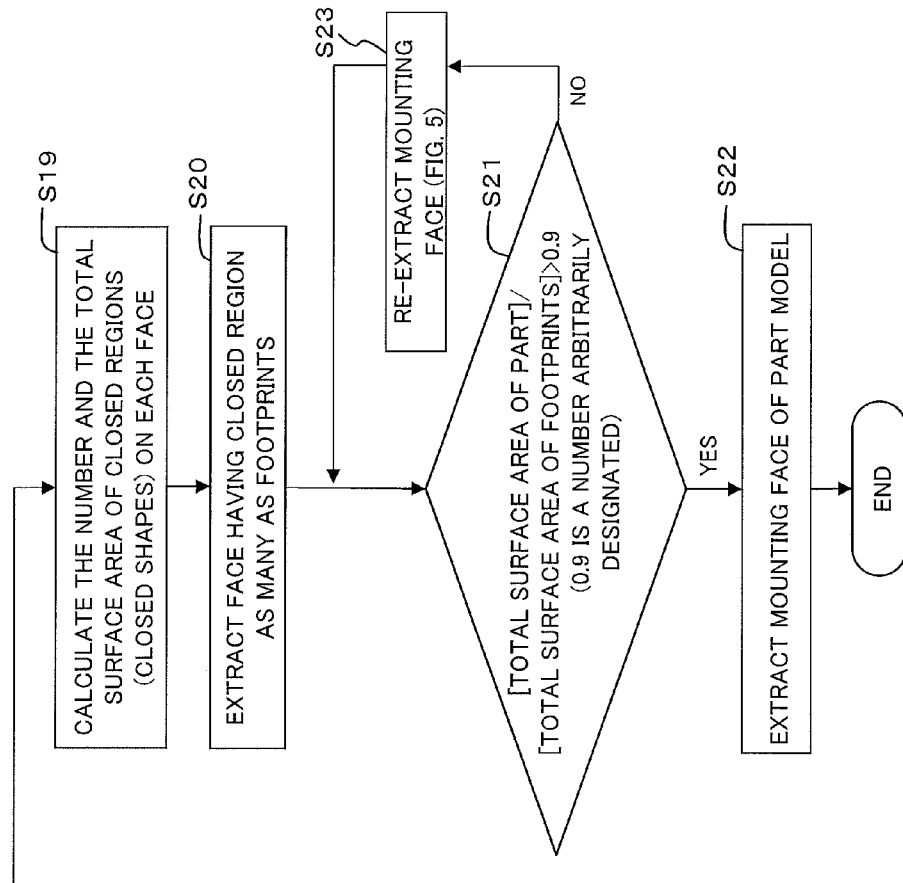
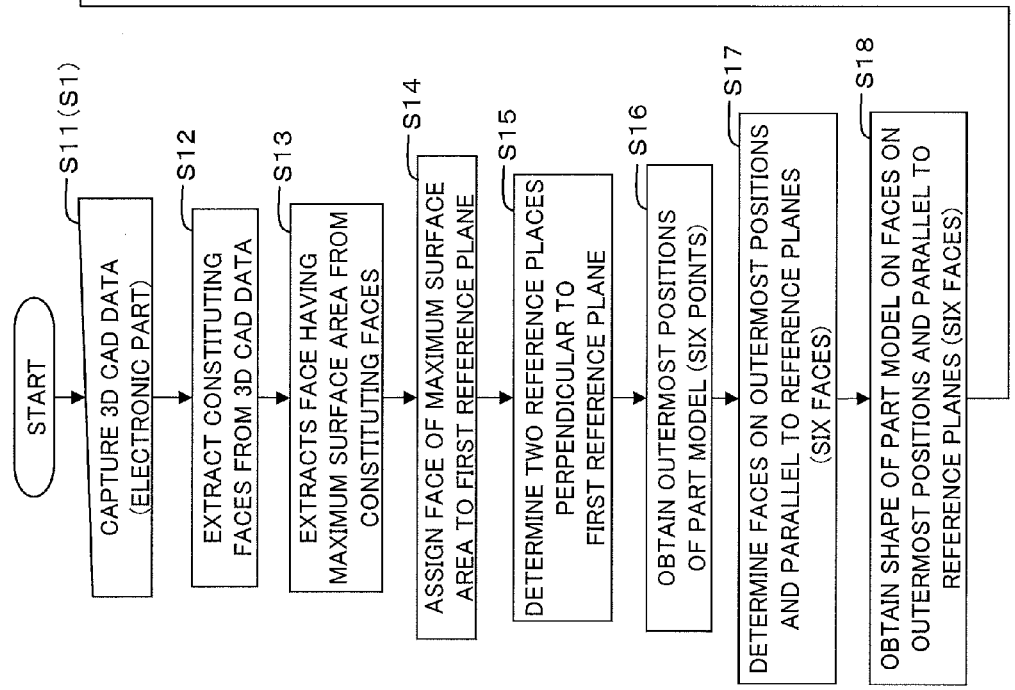

FIG. 6A

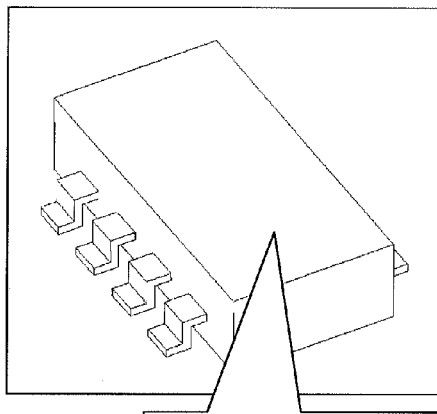

DETERMINE FACE HAVING MAXIMUM SURFACE AREA TO BE FIRST REFERENCE PLANE

FIG. 6B

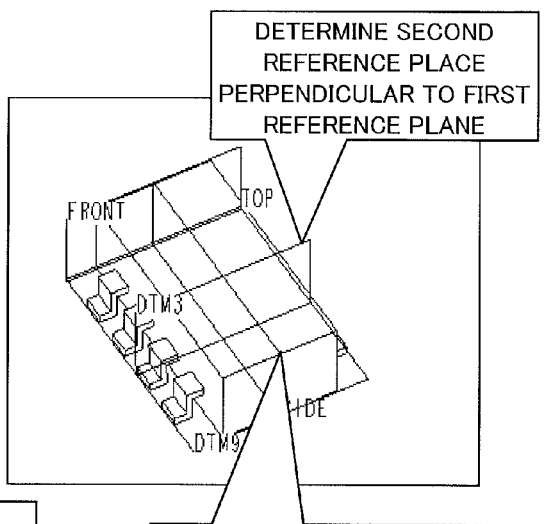

DETERMINE SECOND REFERENCE PLACE PERPENDICULAR TO FIRST REFERENCE PLANE

DETERMINE THIRD REFERENCE PLANE PERPENDICULAR TO FIRST AND SECOND REFERENCE PLANES

FIG. 6C

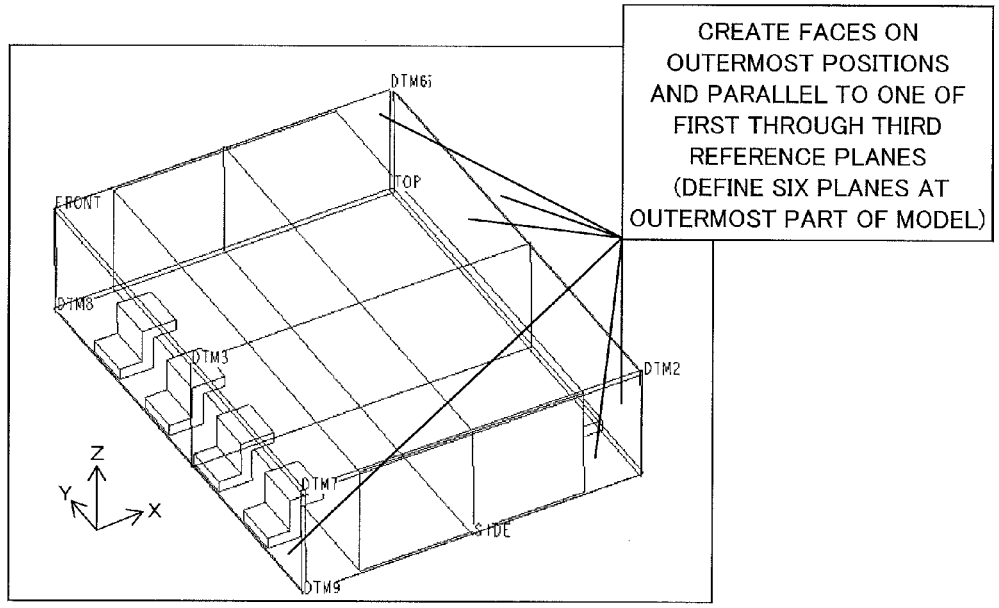

CREATE FACES ON OUTERMOST POSITIONS AND PARALLEL TO ONE OF FIRST THROUGH THIRD REFERENCE PLANES (DEFINE SIX PLANES AT OUTERMOST PART OF MODEL)

SHAPE OF PLANE AT TOP
OUTERMOST POSITION
NUMBER OF RECTANGLES: 1
SURFACE AREA: 75 mm²

SHAPE OF PLANE AT SIDE
OUTERMOST POSITION
NUMBER OF RECTANGLES: 4
SURFACE AREA: 15 mm²

SHAPE OF PLANE AT BOTTOM
OUTERMOST POSITION
NUMBER OF RECTANGLES: 8
SURFACE AREA: 47 mm²

SHAPE OF FOOTPRINTS ON PCB
NUMBER OF RECTANGLES: 8
SURFACE AREA: 52 mm²

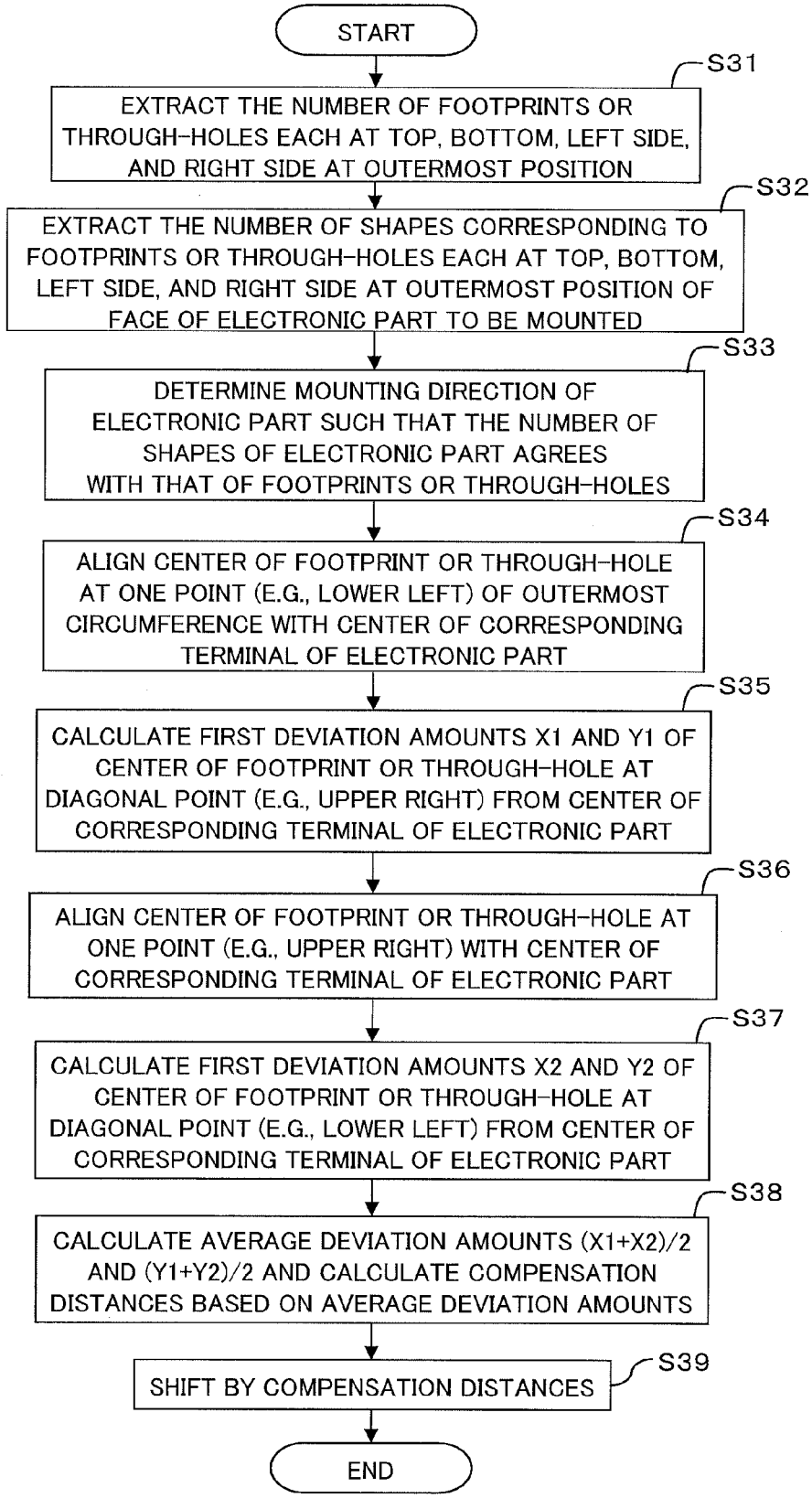

ALIGN CENTER OF FOOTPRINT WITH THAT OF TERMINAL

CALCULATE AMOUNT (SECOND DEVIATION AMOUNT) X2 OF DEVIATION OF CENTER OF TERMINAL FROM CENTER OF FOOTPRINT

DETERMINE OPTIMUM ARRANGEMENT POSITION OF TERMINAL ON FOOTPRINT (THROUGH-HOLE) ON THE BASIS OF FIRST AND SECOND DEVIATION AMOUNTS

FIG. 14A
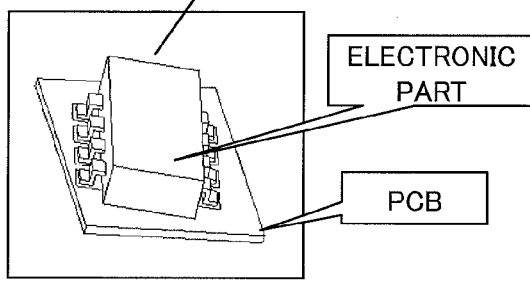
FIG. 14B
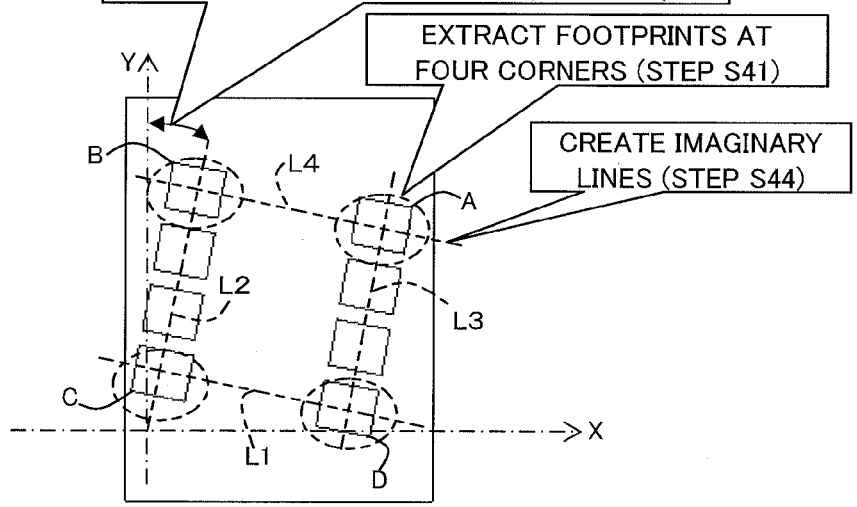
FIG. 14C  FIG. 14D  FIG. 14E
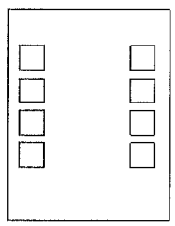 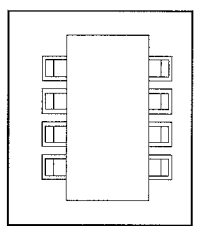 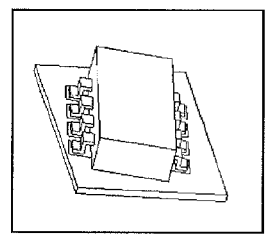

JUDGE TYPE OF ASSEMBLING TO BE INSERTION TYPE ON THE BASIS OF THE HOLE-SHAPE OF PCB AND TERMINAL-SHAPE OF ELECTRONIC PART (STEPS S51-S53)

EXTEND DIAMETER OF HOLE ON PCB AND DEFINE PLANE AT POINT a WHERE EXTENSION LINE L CROSSES SHAPE OF ELECTRONIC PART TO BE FIXED PLANE F OF ELECTRONIC PART (STEP S54)

AIDING DEVICE, AND NON-TRANSITORY COMPUTER-READABLE RECORDING MEDIUM IN WHICH DESIGN AIDING PROGRAM IS STORED

CROSS-REFERENCE TO RELATED APPLICATIONS

This application is based upon and claims the benefit of priority of the prior Japanese Patent Application No. 2010-196783, filed on Sep. 2, 2010, the entire contents of which are incorporated herein by reference.

FIELD

The present invention relates to a design aiding device and a non-transitory computer-readable recording medium in which a design aiding program is stored.

BACKGROUND

In normal production of mechanical products and mechanical units incorporating printed circuit boards (PCBs) that mounts electronic parts thereon, a mechanical CAD (Computer Aided Design) system and a PCB CAD system are used. Mechanical design by a mechanical CAD system is carried out in parallel to electric design by a PCB CAD system.

Here, a mechanical CAD system designs mechanical products and mechanical units that are to accommodate PCBs, and for this purpose, creates part data about casing, electronic parts, and mechanical parts serving as parts to be designed.

A PCB CAD system makes an electric design of the outer shapes of PCBs that is the boards to be designed and wiring patterns on the PCBs, and thereby creates board data. Here, a wiring pattern includes footprints that attach terminals of an electronic part disposed thereon through soldering or through-holes that fix terminals of an electronic device after the terminals are inserted into the holes.

As the above, the mechanical design by a mechanical CAD system and the electric design by a PCB CAD system are carried out in parallel to each other, so that the part data and the board data are created by different systems of the mechanical CAD system and the PCB CAD system, respectively. For this reason, there is a requirement of confirming the interference or other relationship between the part data and the board data. Accordingly, the confirmation requires the mechanical CAD system and the PCB CAD system to unite with each other so that both the part data and the board data are referred and compared with each other.

As one example, the following manners (a) and (b) each conventionally unite a mechanical CAD system and a PCB CAD system 2, that is, unite part data and board data.

(a) The designer captures, through manual operation, board data created by a PCB CAD system into a mechanical CAD system, and, on the mechanical CAD system, confirms the arrangement position of parts and checks interferences and spaces between each part to be mounted onto a PCB and a structure created by the mechanical CAD. Specifically, the designer determines the positional relationship among a casing, parts, and a PCB through manual operation. At that time, the designer determines the positional relationship in the mechanical CAD system using the predetermined reference position (reference origin) for each part on the PCB and the reference position of each part. Thereby, both the part data created by the mechanical CAD system and the board data created by the PCB CAD system can be confirmed.

(b) There is proposed a technique of, when the board data created by the PCB CAD system is captured into the mechanical CAD system, replacing the respective parts of the PCB CAD system with detailed part data created by the mechanical CAD system using part data of the PCB CAD system.

[Patent Reference 1] Japanese Laid-Open Patent Publication No. 2008-84211
[Patent Reference 2] Japanese Laid-Open Patent Publication No. 2009-116743
[Patent Reference 3] Japanese Laid-Open Patent Publication No. HEI 9-167172
[Patent Reference 4] Japanese Laid-Open Patent Publication No. HEI 9-311878
[Patent Reference 5] Japanese Laid-Open Patent Publication No. 2002-324084

However, since the above manner (a) compels the designer to capture data and determine the positional relationship through manual operation, which means a large amount of load of the designer. If the data created by an external CAD system does not have a reference origin, the designer determines the positional relationship through visually checking the arrangement position of each electronic part with respect to footprints or through-holes on a monitor. This operation has possibilities of human judging mistake, increasing manpower, complexity of confirmation, and increasing steps of the confirmation.

A part model created by the mechanical CAD system is created in the different manner from that of a board model created by the PCB CAD system and has an origin different from that of the board model. Therefore, replacement (see the above manner (b)) of the part data on the board model created by the PCB CAD system with a part model created by the mechanical CAD system on the basis of the board model cannot obtain the right arrangement position of the part. Accordingly, the designer has to correct the position of the model through manual operation, leading to increasing manpower, complexity of confirmation, and increasing steps of the confirmation.

SUMMARY

The design aiding device has requirement of including a first storing section, the second storing section, and a processor. Here, the first storing section that stores board data created for a board that is to be designed; and the second storing section that stored part data created for a part to be designed and arranged on the board. The processor that creates assembled model data, representing an assembled model that assumes arrangement of the part on the board, on the basis of the board data and the part data stored in the first storing section and the second storing section, respectively. Furthermore, the processor includes: a recognizing section that recognizes a mounting face of a part model defined by the part data, the mounting face being mounted on a board model defined by the board data; and an arrangement processing section that creates the assembled model data by arranging the part model on the board model on the basis of the mounting face recognized by the recognizing section.

A non-transitory computer-readable recording medium in which a design aiding program that instructs a processor to create data of an assembled model, in which a part to be designed is arranged on a board to be arranged, on the basis of board data created for the board to be designed and part data created for the part to be designed is stored, wherein the design aiding program instructing the processor to function as the recognizing section and the part arrangement processing section described above.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4 is a flow diagram illustrating a succession of procedural steps of recognizing and extracting a mounting face of a part model onto a board model;

FIGS. 6A through 6C are diagrams illustrating processing of recognizing and extracting a mounting face of a part model onto the board model;

FIG. 8 is a flow diagram illustrating a succession of procedural steps of determining a mounting direction of a part model on a board model and adjusting a position of arranging the part model;

FIGS. 14A through 14E are diagrams illustrating processing of arranging a part model on a board model when a set of footprints or through-holes are oblique to a reference line of the board model;

DESCRIPTION OF THE PREFERRED EMBODIMENTS

Hereinafter, description will now be made in relation to a first embodiment with reference to the accompanying drawings.

Figure 1:
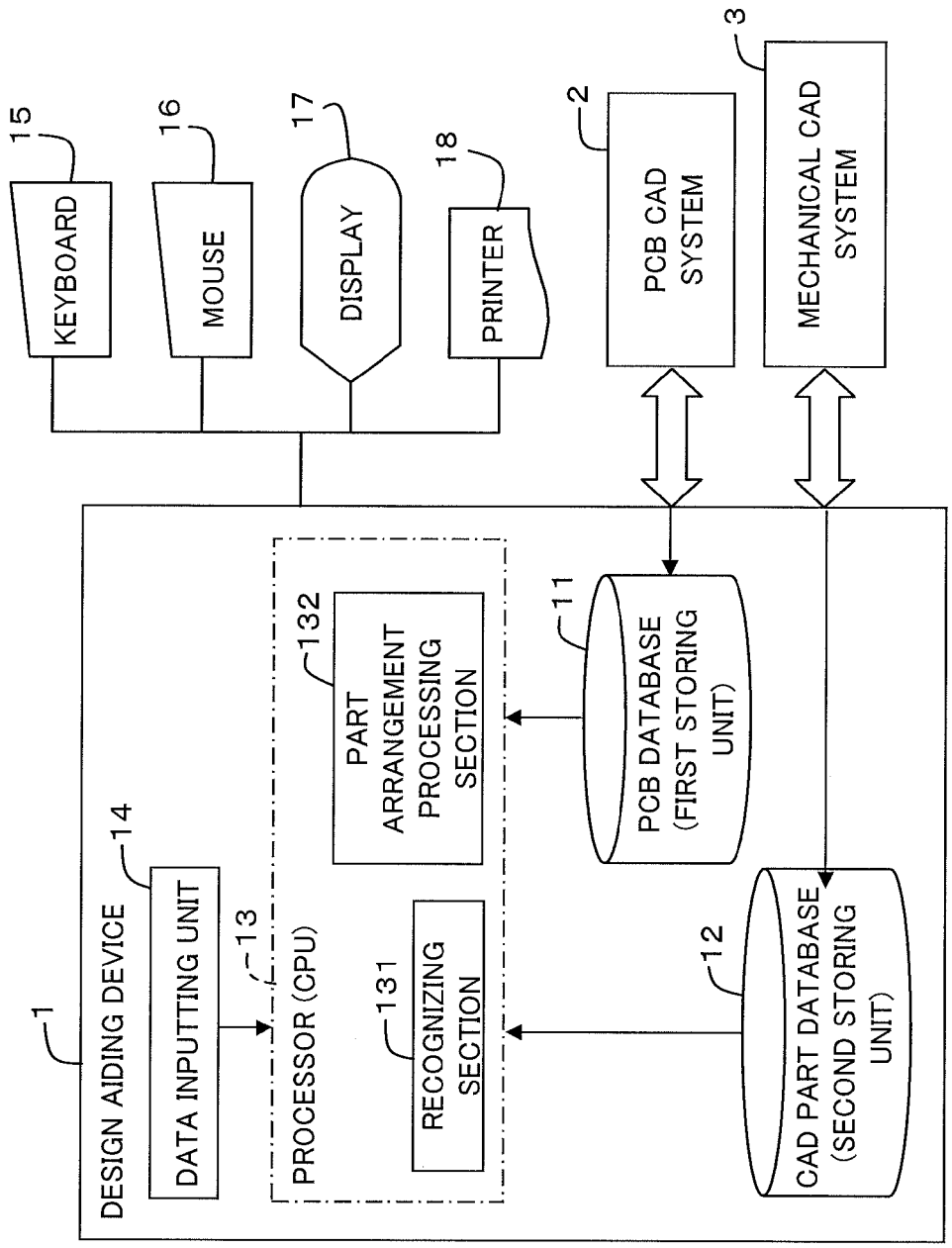
FIG. 1 is a block diagram schematically illustrating a hardware and function configuration of a design aiding device according to a first embodiment.

(1) Configuration of the Design Aiding Device:

FIG. 1 is a block schematically diagram illustrating a hardware and function configuration and a functional configuration of the design aiding device 1 of the first embodiment.

As illustrated in FIG. 1, three-dimensional board data (PCB data) of a printed circuit board (PCB) to be designed is created by a PCB CAD system 2 and is stored in a PCB information database 11 serving as a first storing section of the design aiding device 1 beforehand. Similarly, three-dimensional part data (CAD data) of an electronic part to be designed and to be arranged on the PCB is created by a mechanical CAD system 3 and is stored in a CAD part database 12 serving as a second storing section of the design aiding device 1 beforehand.

Here, the board data stored in the PCB information database 11 includes data of the outer shape of a PCB to be designed and data of the wiring pattern on the PCB. The PCB data defines a board model (e.g. a PCB model). The wiring pattern includes footprints that attach terminals (pins) of an electronic part by soldering or through-holes that attach an electronic part by inserting terminals (pins) of the electronic part into the holes.

Part data stored in the CAD part database 12 includes data of the CAD shapes (part shapes) of the part to be designed and data of the material of the part. The part data defines a part model (e.g., electronic part model) to be mounted onto the board model.

The part data and the board data also include data of association of the part model with footprints or through-holes of the board model on which the part model is to be arranged. This data determines that a part model defined by the part data is to be arranged on which footprints or through-holes on the board model defined by the board data.

A CPU 13 of the design aiding device 1 creates assembled model data that assumes arrangement of the parts to be designed on the board to be designed on the basis of the board data and the part data created by two different CAD systems 2 and 3 and stored in the DB 11 and 12, respectively. Namely, the design aiding device 1 unites the board data and the part data created by two different CAD systems 2 and 3 with each other. The design aiding device 1 may be included in the PCB CAD system 2 or the mechanical CAD system 3, and may alternatively be in the form of an independent unit of the PCB CAD system 2 and the mechanical CAD system 3. In the first embodiment, the DBs 11 and 12 are included in the design aiding device 1, but may be alternatively included in the PCB CAD system 2 and the mechanical CAD system 3, respectively.

The design aiding device 1 is a computer such as a normal personal computer. The design aiding device 1 includes a memory including the above DBs 11 and 12, and a processor 13, and additionally includes a data inputting unit 14 that inputs various data including the part data and the board data into the device 1. The design aiding device 1 further includes an input device that is operated by a designer to input various pieces of data into the device 1 and an output device that outputs results of processing by the processor 13 to the designer. Examples of the input device is a keyboard 15 and a mouse 16, and examples of the output device is a monitor 17, a printer 18, and interfaces (not illustrated) to respective storing media. The processor 13 is a Central Processing Unit (CPU) and others. The memory including the DBs 11 and 12 may be an internal memory device such as a Random Access Memory (RAM), a Hard Disk Drive (HDD), and a Solid State Drive (SSD), or an external memory device.

The processor 13 executes a design aiding program to thereby function as a recognizing section 131 and a part arrangement processing section 132 that are to be described later. The design aiding program is previously installed in the memory of the design aiding device 1.

Next, detailed description will now be made in relation to the functions of the recognizing section 131 and the part arrangement processing section 132 performed by the processor 13.

The recognizing section 131 recognizes a mounting face of a part model (electronic part) defined by the part data which face is to be mounted onto the board model (the PCB model) defined by the board data. The recognizing section 131 serves the following functions (A1) through (A5). The board model is a model of the PCB that is a board to be designed and hereinafter the board model is also referred to as a PCB. Similarly, the part model is a model of an electronic device to be designed and hereinafter the part model is also referred to as an electronic part.

(A1) The recognizing section 131 determines a first reference plane including a face having a maximum surface area of the part model and a second reference plane and a third reference plane which are perpendicular to the first reference plane and which are perpendicular to each other as detailed below with reference to steps S11 through S15 of FIG. 4 and FIGS. 6A and 6B.

(A2) The recognizing section 131 sets six planes parallel to one of the first through the third reference planes determined in the above (A1) and which contact one with each of six outermost planes of the part model as detailed below with reference to steps S16 and S17 of FIG. 4 and FIG. 6C.

(A3) The recognizing section 131 obtains shapes of the outermost planes of the six planes set in above (A2) as to be detailed below with reference to step S18 of FIG. 4 and FIG. 7A.

(A4) The recognizing section 131 recognizes one of the six outermost planes as the mounting face on the basis of the shape of the six outermost planes obtained in the above (A3) and information about an arrangement face of the board model on which the part model is to be arranged, the information being included in the board data. Specifically, the recognizing section 131 recognizes one of the six outermost planes as the mounting face on the basis of the number of closed shapes and the total surface area of the closed shapes on each of the six outermost planes and also on the basis of the number of footprints or through-holes and the total surface area of the footprints or the through-holes on the arranging face of the board model from the board data. The recognizing section 131 of the first embodiment recognizes, as the mounting face, one of the outermost planes which has closed shapes as many as the footprints or the through-holes and which has a ratio of the total area of the closed shapes related to the footprints or through-holes in a predetermined range as detailed below with reference to steps S19 through S22 of FIG. 4 and FIGS. 7A and 7B.

Figure 5:
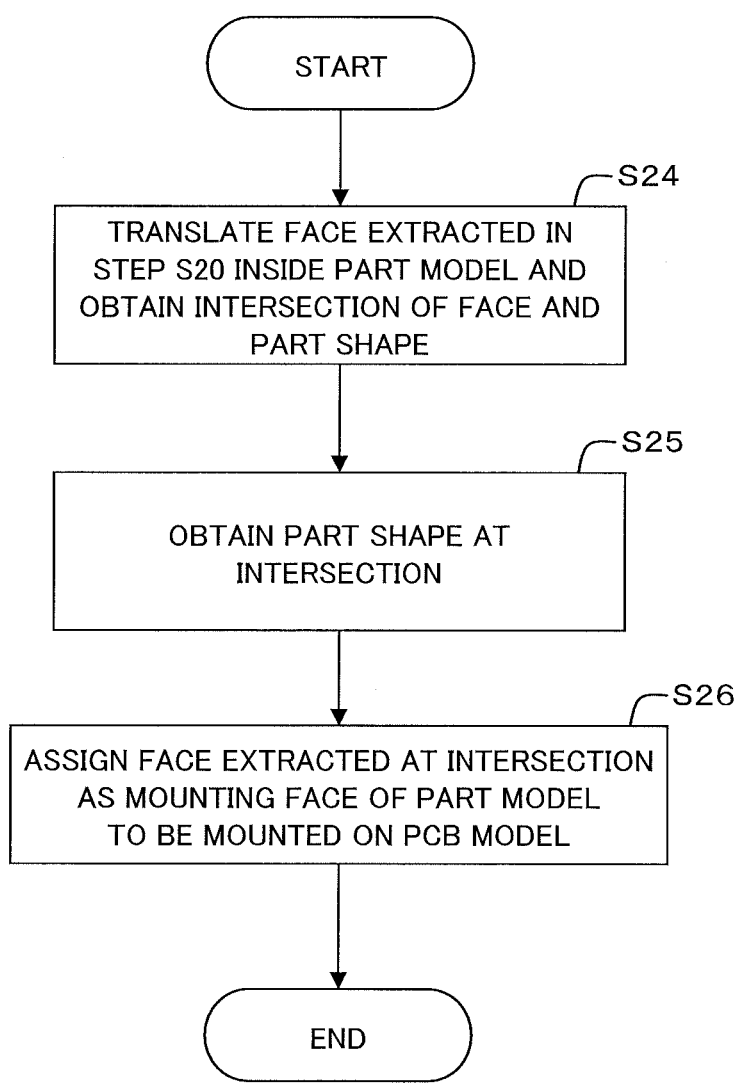
FIG. 5 is a flow diagram illustrating a succession of procedural steps of recognizing and extracting a mounting face of a part model onto a board model (i.e., procedural steps of re-extracting a mounting face)

(A5) The recognizing section 131 further re-extracts a mounting face in the following manner as detailed below with reference to step S23 of FIG. 4 and FIG. 5. Specifically, if one of the six outermost planes has closed shapes as many as the footprints or through-holes while the ratio of the total surface area of the closed shapes to that of the footprints or through-holes is equal to the predetermined value or less, the recognizing section 131 judges that the type of assembling is an insertion type. The insertion type arranges the part model on the board model by inserting terminals (pins) of the mounting face of the part model into the through-holes of the board model. In the insertion type, a terminal sometimes has a diameter thinning toward the tip thereof, so that the terminal is surely guided into the corresponding through-hole.

Accordingly, if the ratio of the total surface area is the predetermined value or less, the recognizing section 131 judges the assembling type is an insertion type. The recognizing section 131 translates an extracted plane parallel to the outermost plane used for judging the assembling type inside the part model and obtains the shape of the extracted plane at the point where the extracted plane comes into contact with the body of the part model. After that, if the ratio of the total surface area of closed shapes on the extracted plane at the intersection to the total surface area of the through-holes is within the predetermined range, the recognizing section 131 recognizes the extracted plane to be the mounting face.

The part arrangement processing section (arrangement processing section) 132 arranges the part model onto the board model on the basis of the mounting face extracted and recognized by the recognizing section 131 and thereby creates the assembled model data. The part arrangement processing section 132 serves the following functions (B1) through (B4).

(B1) The part arrangement processing section 132 determines the mounting direction of the part model on the board model as to be described below with reference to steps S31 through S33 of FIG. 8 and FIGS. 9A, 9B, and 12. The mounting direction is determined on the basis of a first state of arrangement of a number of terminals (pins) corresponding one to each of the closed shapes on the mounting face extracted and recognized by the recognizing section 131 and a second state of arrangement of the footprints or the through-holes on the arranging face of the board model to mount the part model which second state is obtained from the board data. The part arrangement processing section 132 arranges the part model on the board model in the determined mounting direction using the following functions (B2) and (B3).

(B2) The part arrangement processing section 132 calculates a first deviation amount as to be detailed below with reference to steps S34 and S35 of FIG. 8 and FIGS. 10A through 10C. Here, a first deviation amount is calculated under a state where the part model is arranged on the board model such that the center position of one (first terminal) of the terminals on the mounting face coincides with the center position of the footprint and the through-hole corresponding to the first terminal. Specifically, a first deviation amount represents a distance between the center position of another one (second terminal) of the terminals and the center position of the footprint or through-hole corresponding to the second terminal under the above alignment state. Furthermore, the part arrangement processing section 132 calculates a second deviation amount as detailed below with reference to steps S36 and S37 of FIG. 8 and FIG. 11A. A second deviation amount is calculated under a state where the part model is arranged on the board model such that the center position of the second terminal coincides with the center position of the corresponding footprint or through-hole. The second deviation amount represents a distance between the center position of the first terminal and the center position of the corresponding footprint or through-hole under this alignment state. The part arrangement processing section 132 adjusts the arrangement position of the part model on the board model on the basis of the first deviation amount and the second deviation amount calculated in the above manner as to be detailed below with reference to steps S38 and S39 of FIG. 8 and FIGS. 11B and 11C. The first terminal and the second terminal are preferably two terminals having a largest distance (e.g., terminals on a diagonal).

(B3) If a set of footprints or through-holes are oblique to a reference line of the board model, the part arrangement processing section 132 arranges the part model of the board model as to be detailed below with reference to FIGS. 13 and 14A through 14E. For this purpose, the part arrangement processing section 132 obtains information of a set of footprints or through-holes on the board model to mount the part model from the board data. The part arrangement processing section 132 judges whether the set of footprints or through-holes is oblique to the reference line of the board model on the basis of the obtained information. If the set of footprints or through-hole is not oblique to the reference line of the board model, the part arrangement processing section 132 arranges a part using the functions (B1) and (B2). In contrast, if the set of footprints or through-hole is oblique to the reference line of the board model, the part arrangement processing section 132 calculates an angle between the set of footprints or through-hole and the reference line of the board model on the basis of the obtained information. The part arrangement processing section 132 then rotates the set of footprints or through-hole by the calculated angle in a predetermined direction and arranges the part model on or through the set of footprints or through-hole after being rotated using the above functions (B1) and (B2). After that, the part arrangement processing section 132 rotates the part model arranged on or through the set of footprints or through-hole together with the set of footprints or through-hole by the same angle in the reverse direction and then arranges the part model on the board model.

(B4) The part arrangement processing section 132 judges the type of assembling the assembled model on the basis of the board data and the part data, and arranges the part model on the board model on the basis of the type of assembling and the mounting face recognized by the recognizing section 131 as to be detailed below with reference to FIGS. 15 and 16A through 16C. The assembling type is surface mount in addition to the insertion type described above. The insertion type arranges the part model on the board model by inserting terminals (pins; closed shapes) disposed on the mounting face of the part model into the through-holes of the board model. The surface mount arranges the part model on the board model by mounting terminals (pins; closed shapes) disposed on the mounting face of the part model onto the footprints disposed on the board model. If judging that the assembling type is the insertion type, the part arrangement processing section 132 defines a plane, which is parallel to the mounting face at the point where a straight line along an inner circumference of a through-hole in the depth direction of the through-hole crosses the part model, as a fixed plane, and arranges the part model on the board model such that the fixed plane is flush with the arranging surface of the board model. In contrast, if judging that the assembling type is the surface mount, the part arrangement processing section 132 arranges the part model on the board model such that the mounting face of the part model is flush with the arranging surface of the board model.

(2) Operation of the Design Aiding Device:

The functions and the operation of the design aiding device 1 having the above configuration will now be described with reference to FIGS. 2 through 16C.

Figure 2:
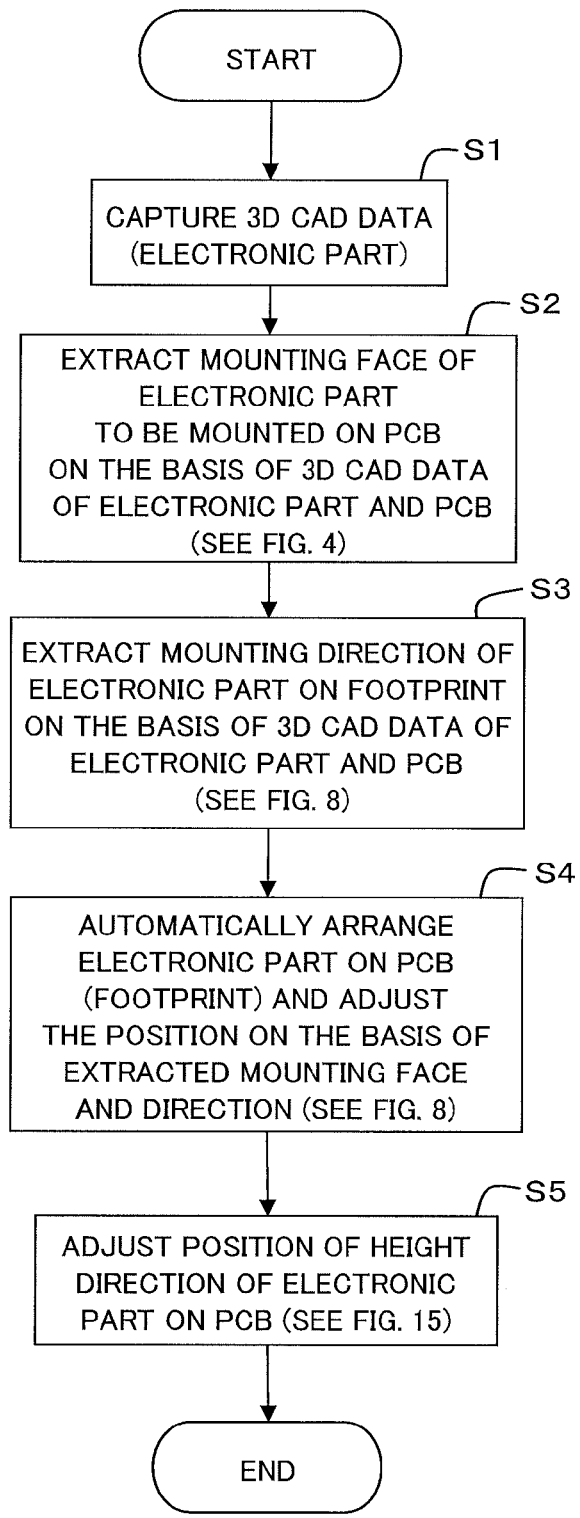
FIG. 2 is a flow diagram illustrating an outline of procedural steps carried out by a design aiding device of FIG. 1.
Figure 3:
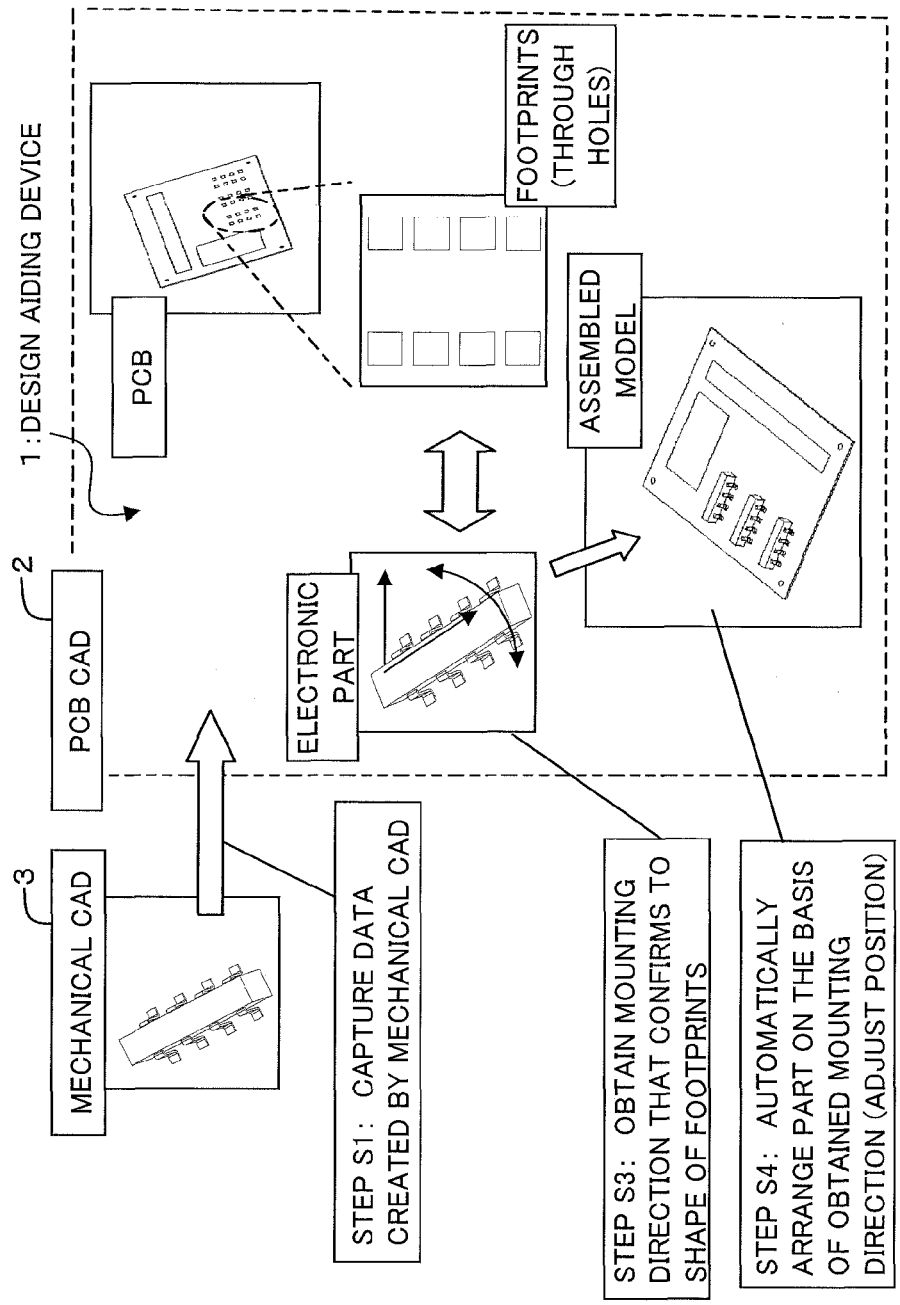
FIG. 3 is a diagram illustrating an outline of processing carried out by a design aiding device of FIG. 1.

(2-1) Outline of Processing by the Design Aiding device:

Referring to FIGS. 2 and 3, description will now be made in relation to the entire flow, i.e., the outline, of processing (steps S1 through S5) of the design aiding device 1 illustrated in FIG. 1. Here, the design aiding device 1 is assumed to be included in the PCB CAD system 2 as illustrated in FIG. 3.

For the beginning, part data (three-dimensional (3D) CAD data) of a part model (electronic device) which data is created by the mechanical CAD system 3 is captured into the design aiding device 1 of the PCB CAD system 2 and is then stored in the CAD part database 12 (step S1). The PCB information database 11 stores board data (3D CAD data) of the board model (PCB) which data is created by the PCB CAD system 2.

Then, the recognizing section 131 of the design aiding device 1 recognizes and extracts a mounting face of the part model to be mounted onto the board model on the basis of the shape information of the part model included in the part data stored in the DB 12 and arrangement information of the footprints or the through-holes included in the board data stored in the DB 11 (step S2). The recognition and extraction of the mounting face carried out through the procedure (to be described below) of the flow diagrams in FIGS. 4 and 5.

The recognizing section 131 of the design aiding device 1 determines the mounting direction of the part model on the board model on the basis of a state of arrangement of a number of terminals (pins) corresponding to the closed shapes of the mounting face recognized in step S2 and arrangement information of the footprints or the through-holes included in the board data stored in the DB 11 (step S3). The determination of the mounting direction is carried out through the procedure (to be described below) of steps S31 through S33 of FIG. 8 to be detailed below.

Then the recognizing section 131 of the design aiding device 1 automatically arranges the part model on the board model on the basis of the mounting face recognized in step S2 and the mounting direction determined in step S3. For the arrangement, the recognizing section 131 further adjusts the arrangement position of the part model (step S4) through the procedure (to be detailed below) of steps S34 through S39 of FIG. 8.

Then the recognizing section 131 of the design aiding device 1 judges the type of assembling, obtains (and extracts) the position of the height direction (position of assembling) of the part model with respect to the board model, and adjusts the position (assembled position) of the height direction of the part model in accordance with the judged assembling type (step S5). The assembling processing (adjusting the position of the height direction) is carried out through the procedure (to be detailed below) of the flow diagram in FIG. 15.

The above series of processing in the design aiding device 1 creates the assembled model data that assumes arrangement of the part model on the board model by uniting the board data and the part data which the different CAD systems 2 and 3 create with one another, as illustrated in FIG. 3. Specifically, the mounting face and the mounting direction of the part model on the board model are obtained on the basis of which the 3D model of the electronic part created by the mechanical CAD system 3 is automatically positioned and then arranged/mounted onto the board model created by the PCB CAD system 2.

(2-2) Recognition and Extraction of the Mounting Face of the Part Model:

Next, description will now be made in relation to recognition and extraction of the mounting face of the part model performed through the procedure (steps S11 through S22) of the flow diagram of FIG. 4 with reference to FIGS. 6A-6C, 7A, and 7B, which illustrate processing of recognition and extraction of the mounting face of the part model onto the board model.

As a first step, the part data (three-dimensional 3D) CAD data) of a part model (electronic device) which data is created by the mechanical CAD system 3 is captured into the design aiding device 1 of the PCB CAD system 2 (step S11; corresponding to step S1 of FIGS. 2 and 3).

After that, in order to arrange the electronic device created by the mechanical CAD system 3 on the footprints or the through-holes created by the PCB CAD system 2, first through third reference planes are determined on the basis of the 3D CAD data of the part model created by the mechanical CAD system 3 through the following procedure.

The recognizing section 131 extracts a number of constituting faces of the electronic device from the part data (step S12) and further extracts a face having the maximum surface area from the extracted constituting faces (step S13). Then the recognizing section 131 assigns and defines the constituting face having the maximum surface area extracted in step S13 as a first reference plane (step S14, see FIG. 6A). Furthermore, the recognizing section 131 sets and defines a second reference plane and a third reference plane which are perpendicular to the first reference plane and which are perpendicular to each other (step S15). The second reference plane and the third reference plane are each parallel to two of the constituting faces extracted in step S12.

The recognizing section 131 then obtains positions of the outermost shapes, i.e., the outermost positions, of the part model on the basis of the part data (step S16). Specifically, the recognizing section 131 obtains 6 points each having the maximum or minimum X, Y, and Z coordinates on the basis of the X, Y, and Z directions (see FIG. 6C) as the outermost positions.

The recognizing section 131 determines faces on the outermost positions obtained in the previous step and parallel to the first through the third reference plane (step S17). As illustrated in FIGS. 6B and 6C, two faces parallel to the first, reference plane are set at the two positions having the maximum and the minimum Z coordinates; two faces parallel to the second reference plane are set at the two positions having the maximum and the minimum Y coordinates; and two faces parallel to the third reference plane are set at the two positions having the maximum and the minimum X coordinates. The above manner defines and sets six planes (six outer faces) which are parallel to one of the first through the third reference planes and which are contact one with each of the six outermost planes.

Figure 7A:
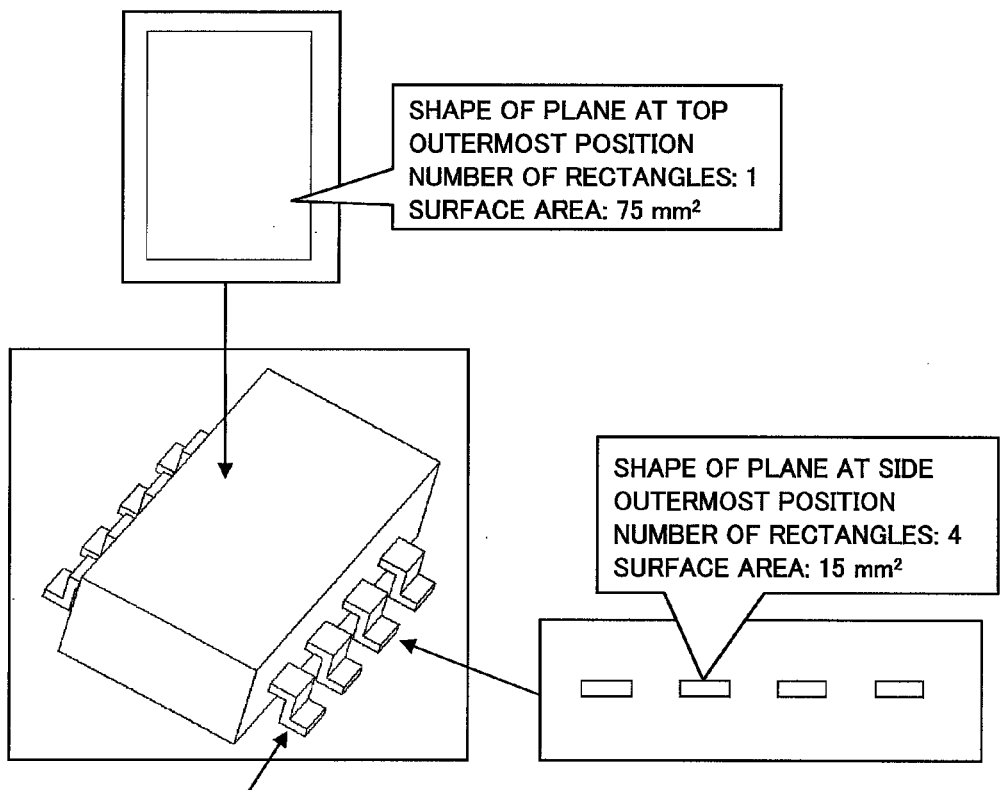
FIGS. 7A and 7B are diagrams illustrating processing of recognizing and extracting a mounting face of a part model onto the board model.

After that, the recognizing section 131 obtains the shapes of the respective outermost planes, i.e., the shapes of the part model, on the six planes determined in step S17, as illustrated in, for example, FIG. 7A (step S18). The recognizing section 131 calculates the number of closed shapes (rectangles) and the total surface area of the closed shapes of each of the six plane shapes obtained in step S18 (step S19). FIG. 7A illustrates three outermost planes and the number of rectangles and the total surface area of the rectangles on each plane. Specifically, the shape on the plane on the top outermost shape position has a single rectangle and the total surface area of the rectangle of 75 mm$^2$; the shape on the plane on a side outermost shape position has four rectangles and the total surface area of the rectangles of 15 mm$^2$; and the shape on the plane on the bottom outermost shape position has eight rectangles and the total surface area of the rectangles of 47 mm$^2$.

Figure 7B:
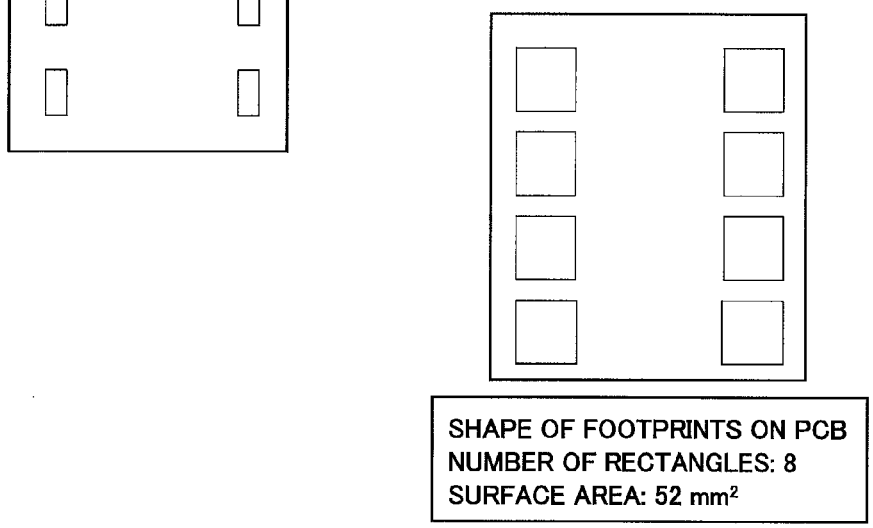

Furthermore, as illustrated in, for example, FIG. 7B, the recognizing section 131 obtains, from the board data, information about the arrangement and the shapes of the set of footprints or through-holes on which an electronic device to be assembled is arranged, and calculates the number of footprints or through-holes and the total surface area of the footprints or the through-holes on the arranging surface of the board model to arrange the part model. The footprint shape illustrated in FIG. 7B has eight footprints (rectangles) and the total face area of 52 mm$^2$. The recognizing section 131 extracts one plane which has closed regions (i.e. closed shapes) as many as the footprints (or the through-holes) from the six planes (step S20). In the example of FIGS. 7A and 7B, the bottom face having eight rectangles is extracted from the six planes.

Still further, the recognizing section 131 judges whether the ratio of the total surface area of the rectangles (calculated in step S19) on the face extracted in step S20 to the total surface area of the footprints or the through-holes is larger than a predetermined value (e.g., 0.9) (step S21). If the ratio is larger than the predetermined value (YES route in step S21), the recognizing section 131 recognizes the face extracted in step S20 as the mounting face of the part model onto the board model (step S22). In the example of FIGS. 7A and 7B, the bottom face extracted in step S20 has the total surface area of the rectangles on the face of 47 mm$^2$ and the total surface area of the footprints or the through-holes is 52 mm$^2$, which means the above ratio is 47/52 larger than 0.9. Therefore, the bottom face is extracted as the face to be mounted onto the footprints.

In contrast, if the above ratio is the predetermined value (e.g., 0.9) or less (No route in step S21), the recognizing section 131 judges the type of assembling the assembled model to be the insertion type as described above, and re-extracts the mounting face of the part model (step S23). The processing of re-extraction is carried out according to the flow diagram (steps S24 through S26) of FIG. 5.

Specifically, the recognizing section 131 translates the face (parallel to one of the outermost plane) extracted in step S20 inside the part model (in the upward direction in the example of FIG. 6C) and obtains the position where the extracted face being translated comes into contact with the body of the part model, that is, an intersection of the extracted face being translated and the part shape (step S24). The recognizing section 131 obtains the part shape appearing on the extracted face at the intersection and calculates the total surface area of the cross-section shapes of the part model (step S25), assigns the extracted plane at the intersection to be the mounting face (step S26), and returns to step S21. After that, the recognizing section 131 confirms that the ratio of the total surface area of the closed shape (i.e., the cross-section shapes) on the extracted face to the total surface areas of the through-holes is within a predetermined range (YES route in step S21) and recognizes the extracted surface as the mounting face (step S22).

In the recognizing section 131, one of the outermost planes which has closed shapes as many as the footprints or the through-holes and which has a ratio of the total surface area of the closed shapes to the total surface area of the footprints or the through-holes within the predetermined range is automatically extracted and recognized as the mounting face of the part model onto the board model in the above manner.

Figure 9B:
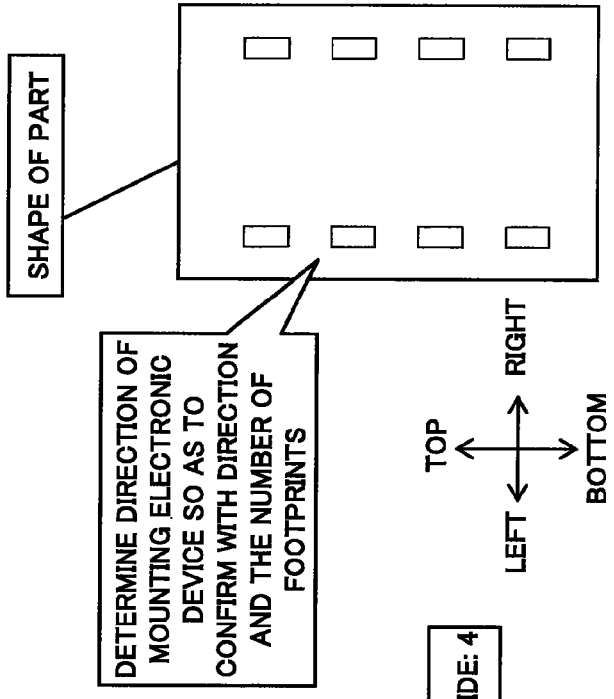
FIGS. 9A and 9B are diagrams illustrating processing of determining a mounting direction of a part model on a board model.
Figure 9A:
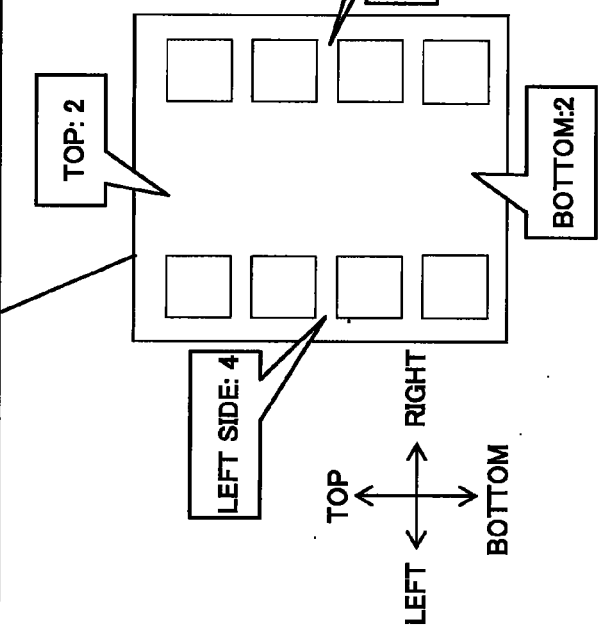

(2-3) Determining the Mounting Direction of the Part Model and Adjusting a Position of Arranging the Part Model:

Next, description will now be made in relation to the procedure (steps S31 through S39) of flow diagram of FIG. 8 to determine the mounting direction and adjust position of arranging the part model by the recognizing section 131 with reference to FIGS. 9A through 12. FIGS. 9A and 9B illustrate processing of determining the mounting direction of the part model on the board model; FIGS. 10A through 10C and FIGS. 11A through 11C illustrate processing of adjusting a position of arranging the part model; and FIG. 12 illustrates processing of determining a mounting direction of a part model having a peculiar pin arrangement onto a board model. Here, the part model of FIGS. 6A-7B, 9A-11C, 14A-14E, and 16A-16C has a symmetric pin arrangement (four×two columns) in the left-right direction while the part model of FIG. 12 has an asymmetric pin arrangement (four on the left and three on the right).

For the beginning, the part arrangement processing section 132 carries out steps S31 through S33 of FIG. 8 to determine the mounting direction of the part model on the board model. At that time, the mounting direction is determined on the basis of the first arrangement of closed shapes (a number of terminals) on the mounting face recognized and extracted by the recognizing section 131 and also on the basis of a second arrangement of the footprints or the through-holes of the arranging face of the board model to arrange the part model which second arrangement is obtained from the board data.

The part arrangement processing section 132 firstly extracts the number of footprints at the top, the bottom, the left side, and the right side at the outermost positions of the PCB (step S31). For example, from a set of footprints illustrated in FIG. 9A, two footprints at the top, two footprints at the bottom, four footprints at the left side, and four footprints at the right side are extracted on the basis of the predetermined top-bottom and left-right directions of the PCB. Besides, from a set of footprint of FIG. 12, two footprints at the top, one footprint at the bottom, four footprints on the left side, and three footprints from the right side are extracted.

The part arrangement processing section 132 extracts the number of closed shapes, corresponding to the footprints, on the mounting face of the electronic part extracted by the recognizing section 131 each at the top, the bottom, the left side, and the right side at the outermost positions (step S32). For example, from the part shape appearing at the mounting face of FIG. 9B, two closed shapes at top, two closed shapes at the bottom, four closed shapes at the left side, and four closed shapes at the right side are extracted on the basis of the predetermined top-bottom and left-right directions of the part model. Beside, from the part shape of FIG. 12 for example, two closed shapes at the top, one closed shape at the bottom, four closed shapes on the left side, and three closed shapes from the right side are extracted.

Then the part arrangement processing section 132 determines the mounting direction of the electronic part onto the PCB such that the numbers at the top, the bottom, the left side, and the right side of the PCB extracted in step S31 coincide with the respective four numbers of the electronic part extracted in step S32 (step S33).

Here in the example of FIGS. 9A and 9B and the example of FIG. 12, the numbers at the top, the bottom, the left side, and the right side of the PCB extracted in step S31 coincide with the respective four numbers of the electronic part extracted in step S32. For this reason, the mounting direction of the electronic part is determined to be the arranging directions of the electronic part illustrated in FIG. 9B and FIG. 12.

If the mounting direction of the part shape is in a state of being rotated by 90 degrees from the state of FIG. 9B, the part arrangement processing section 132 extracts, as closed shapes corresponding to the footprints, four closed shapes at the top, four closed shapes at the bottom, two closed shapes at the left side, and two closed shape at the right side in step S32. Therefore, the direction rotated clockwise or counterclockwise by 90 degrees is determined to be the mounting direction of the electronic part in step S33.

If the mounting direction of the part shape is in a state of being rotated by 180 degrees from the state of FIG. 12, the part arrangement processing section 132 extracts, as closed shapes corresponding to the footprints, one closed shape at the top, two closed shapes at the bottom, three closed shapes at the left side, and four closed shapes at the right side in step S32. Therefore, the direction rotated clockwise or counterclockwise by 180 degrees is determined to be the mounting direction of the electronic part in step S33.

The part arrangement processing section 132 creates assembled model data by arranging the part model on the board model in the mounting direction determined in step S33.

Figure 10A:
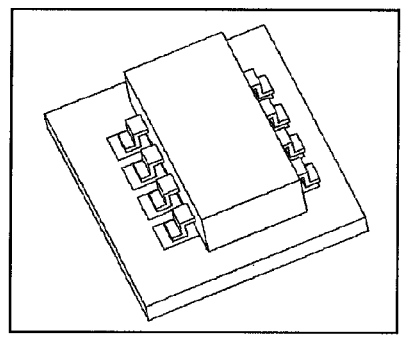
FIGS. 10A through 10C are diagram illustrating processing of adjusting a position of arranging a part model.
Figure 10B:
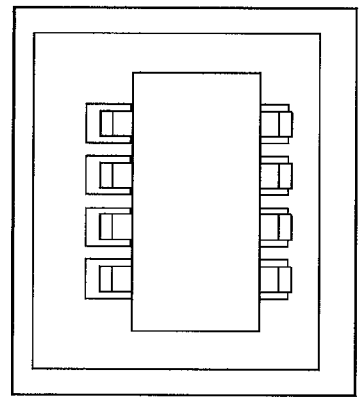
Figure 10C:
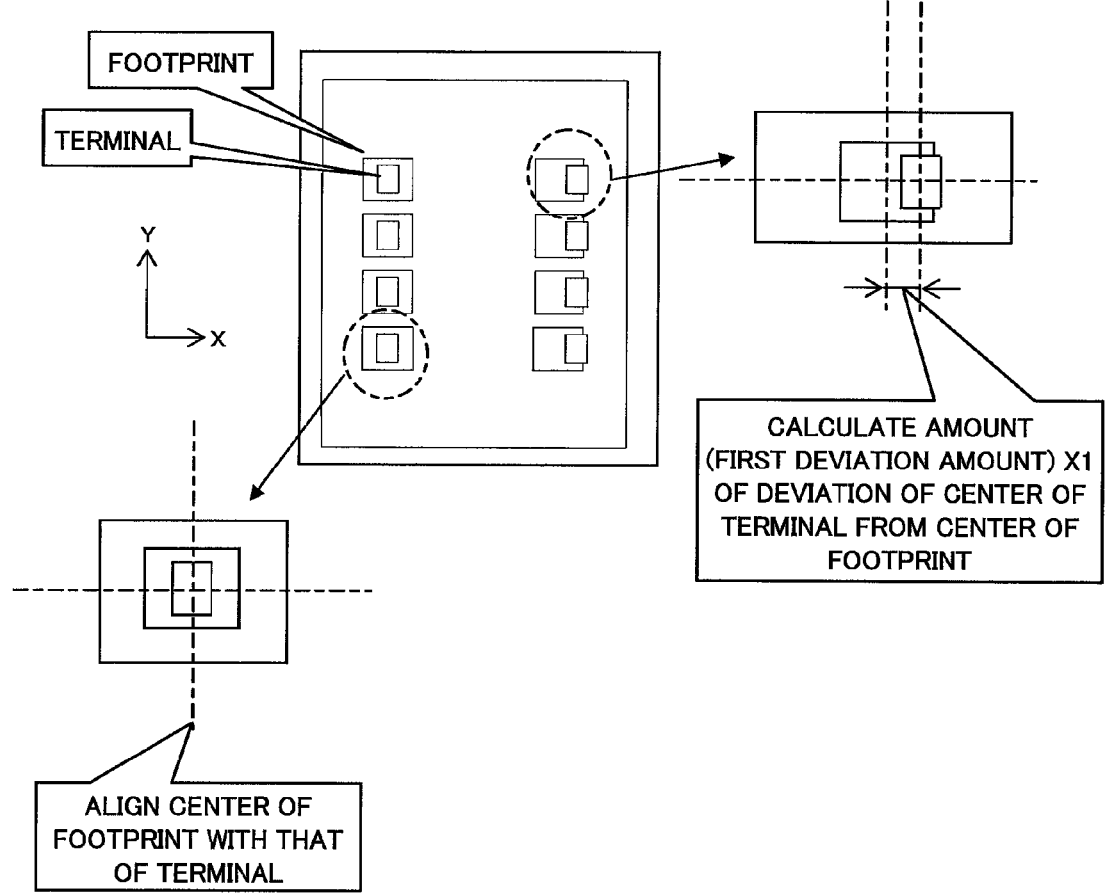

For this purpose, as illustrated in FIGS. 10A through 10C, the part arrangement processing section 132 firstly arranges the part model on the board model in the above mounting direction such that the center position of a first footprint or through-hole at one point of the outermost circumference (e.g., at the bottom left) coincide with the center position of a first terminal at one point of the outermost circumference (e.g., at the bottom left) (step S34). FIGS. 10A and 10B are a perspective view and a plane view of an assembled model, respectively, and FIG. 10C is a plane view illustrating positional relationship between footprints and terminals.

Under a state of the alignment of step S34, the part arrangement processing section 132 calculates first deviation amounts X1 and Y1 of the X and Y directions, respectively as illustrated in FIG. 10C (step S35). Here, the first deviation amounts X1 and Y2 correspond to the distance between the center position of a second footprint or through-hole and the center position of a second terminal, which are the most distant (here, at the top right) from the first footprint or through hole and the first terminal, respectively. The example of FIG. 10C illustrates that the two center positions deviate from each other only in the X direction (X1), so the deviation amount Y1 in the Y direction is zero.

Figure 11A:
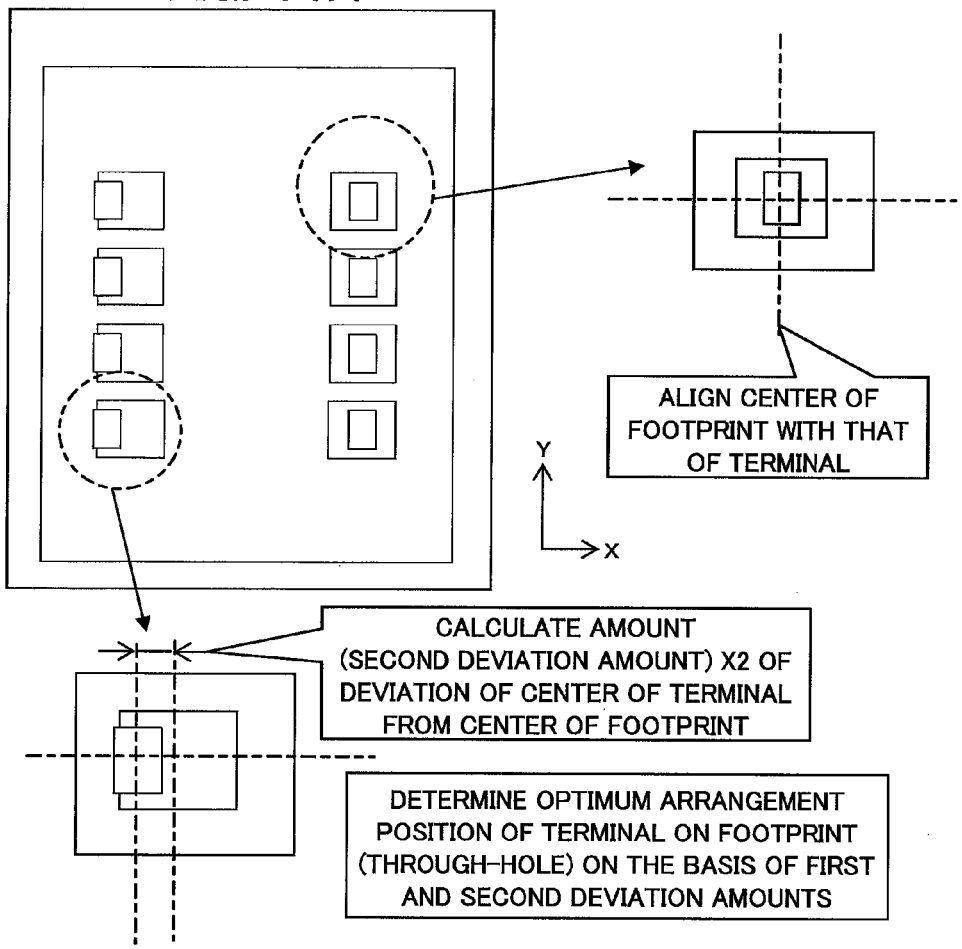
FIGS. 11A through 11C are diagram illustrating processing of adjusting a position of arranging a part model.
Figure 12:
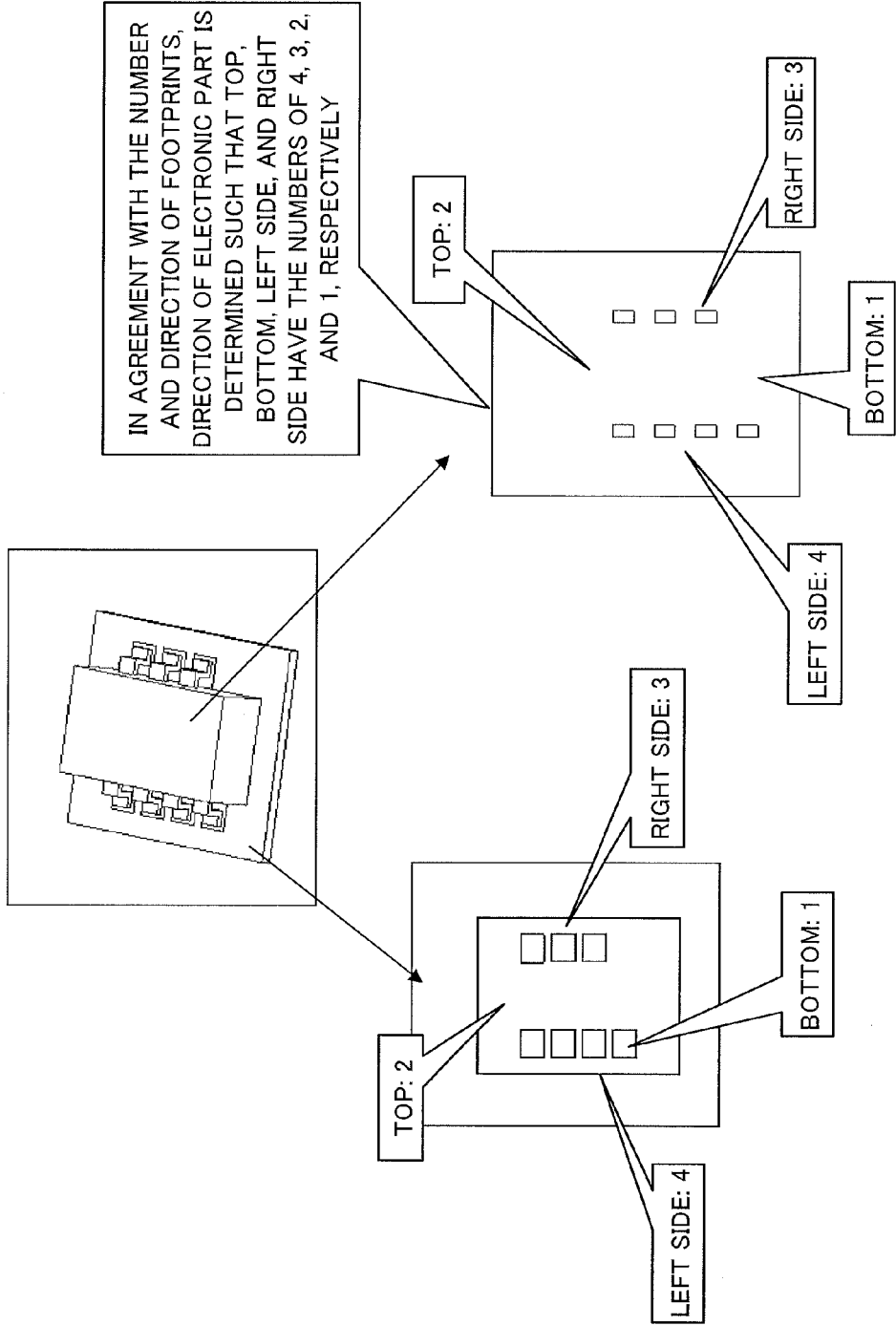
FIG. 12 is a diagram illustrating processing of determining a mounting direction of a part model having a peculiar pin arrangement on a board model.

Then, as illustrated in FIG. 11A, the part arrangement processing section 132 arranges the part model on the board model in the mounting direction such that the center position of the second footprint or through-hole coincide with the center position of the second terminal (step S36).

Under a state of the alignment of step S36, as illustrated in FIG. 11A, the part arrangement processing section 132 calculates second deviation amounts X2 and Y2 in the X and Y directions, respectively (step S37). Here, the second deviation amounts X2 and Y2 correspond to the distance between the center position of the first footprint or through-holes and the center position of the first terminal. The example of FIG. 11A also illustrates that the two center positions deviate from each other only in the X direction (X2), so the deviation amount Y2 in the Y direction is zero. FIG. 11A is a plane view illustrating positional relationship between the footprints and terminals (the mounting face).

Figure 11B:
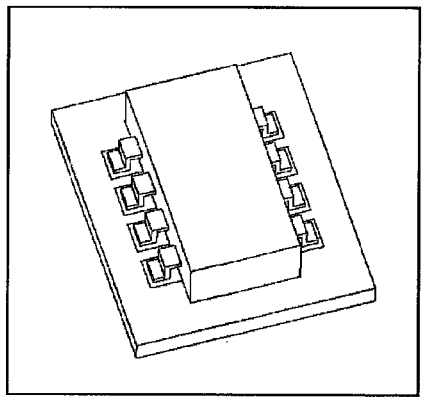
Figure 11C:
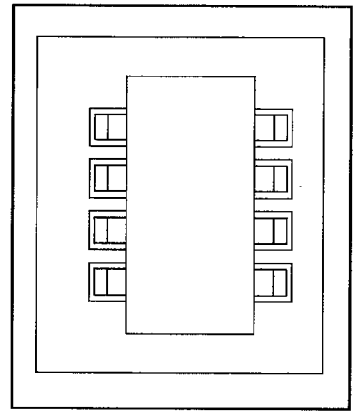

The part arrangement processing section 132 calculates average deviation amounts (X1+X2)/2 and (Y1+Y2)/2 respectively in the X and Y directions based on the first deviation amounts X1 and Y1 and the second deviation amounts X2 and Y2 calculated as above. The part arrangement processing section 132 calculates compensation distance of the arrangement position of the electronic part by halving the average deviation amounts (step S38). After that, the part arrangement processing section 132 shift the electronic part (part model) with respect to the PCB (board model) by the compensation distances calculated in step S38 (step S39). Thereby, the arrangement position of the electronic part is adjusted from the state of FIGS. 10A through 10C to the state of FIGS. 11B and 11C, that is, the optimum state. FIGS. 11B and 11C are a perspective view and a plane view of an assembled model in the optimum arrangement state.

The part arrangement processing section 132 may check the following point after the position of arranging the electronic part with respect to the footprints (or through-holes) is adjusted and determined in the above manner. Specifically, the part arrangement processing section 132 checks whether terminals of the electronic part are disposed within the areas of all the footprints or through-holes or within the areas of four footprints or through-holes arbitrarily designated on the basis of the coordinate positions of the footprints or the through-holes and those of the terminals. If the terminals are disposed within the areas of the footprints or the through-holes, the part arrangement processing section 132 terminates the procedure of arranging. On the other hand, if at least one of the terminals is not disposed within the area of the corresponding footprint or through-hole, the part arrangement processing section 132 judges that the mounting direction of the electronic part is inverse, and therefore inverts the mounting direction of the electronic part and re-adjusts the position of the footprints or through-holes and the mounting position of the electronic parts on the PCB.

If a hole shape is formed in vicinity of a footprint on the PCB and the electronic device has a protrusion shape corresponding to the hole shape, the part arrangement processing section 132 may obtain the prospective position of the electronic part to have a uniform space or a uniform amount of interference between the protrusion shape and the hole shape, and set the prospective position to be the position of arranging the electronic part on the PCB.

Furthermore, the part arrangement processing section 132 adjusts the arrangement position of the thickness direction (perpendicular to the face having the footprints, Z direction) of the electronic part in the following manner. Specifically, the part arrangement processing section 132 calculates an amount of interference in the thickness direction between a footprint and the corresponding terminal under a state of determining the position of the terminals of the electronic parts in the above manner, and then moves the position of the electronic device in the thickness direction such that the interference amount calculated becomes zero.

The part arrangement processing section 132 determines the mounting direction of the part model and adjusts the position of arranging the part model in the above manner. Thereby, the part model can be automatically arranged on the part model with high accuracy to create the assembled model data.

(2-4) Processing of Obliquely Arranging the Part Model:

Next, description will now be made in relation to processing of arranging the part model onto the board mode if the set of footprints or through-holes is oblique to a reference line of the board model through the procedure (steps S41 through S49) of flow diagram of FIG. 13 with reference to FIGS. 14A through 14E. FIGS. 14A through 14E illustrate processing of arranging the part model onto the board mode if the set of footprints or through-holes is oblique to a reference line of the board model. Here, FIGS. 14A through 14E assume an example of arranging an electronic part having a 4×2 symmetric terminal arrangement in the left-right direction onto a PCB.

In some rare cases, a part model is arranged on the board model so as to have a particular angle to a reference line of the board model so that part models representing electronic circuits are efficiently arranged at a high degree of integration. Hereinafter, description will now be made in relation to the procedure of determining the position of a part model on the board model and automatically arranging the part model by the design aiding device 1 in such rare cases.

For the beginning, the part arrangement processing section 132 judges whether the set of footprints or through-holes is oblique to the reference line of the board model, that is, whether the set of footprint or through-hole onto which the electronic part to be assembled is to be mounted forms an angle with respect to the reference line of the PCB (steps S41 through S43). The following description assumes that the electronic part is arranged on a 4×2 symmetric footprint arrangement, but the same processing is carried out when an electronic part is arranged by inserting the terminals thereof into the through-holes.

For example, as illustrated in FIG. 14B, the part arrangement processing section 132 extracts the footprints at four corners from the set of footprints. Then the part arrangement processing section 132 extracts the maximum position A and the minimum position C of the X direction and the maximum position B and the minimum position D of the Y direction in the area of the extracted footprints (step S41). As illustrated in FIG. 14B, the PCB (the board model) has the X and the Y axes that serve as predetermined reference lines and the X and the Y axes define the X and the Y directions, respectively.

The part arrangement processing section 132 judges that:

(1) whether a Y-direction straight line passing through the maximum position A of the X direction extracted in step S41 overlaps the area of the footprint;

(2) whether an X-direction straight line passing through the maximum position B of the Y direction extracted in step S41 overlaps the area of the footprint;

(3) whether an Y-direction straight line passing through the minimum position C of the X direction extracted in step S41 overlaps the area of the footprint; and (4) whether an X-direction straight line passing through the minimum position D of the Y direction extracted in step S41 overlaps the area of the footprint (step S42).

If the results of all of the judgment (1) through (4) are negative, the part arrangement processing section 132 judges that the set of footprints is oblique to the reference line of the board model (step S43). Namely, the set of footprints is judged to have an angle $\alpha(\neq 0)$ with respect to the reference line of the PCB. On the other hand, if the set of footprints is judged not to have an angle ($\alpha=0$) with respect to the reference line of the PCB, the part arrangement processing section 132 automatically arranges the part model onto the set of footprints through the procedure described above with reference to FIGS. 4 through 12. The part arrangement processing section 132 judges the presence or the absence of the angle $\alpha$ on the basis of the results of the above judgments (1) through (4), but alternatively may make the judgment on the basis of information of an angle of the electronic part included in the PCB information serving as the board data.

If the set of footprints is judged to have an angle $\alpha(\neq 0)$ with respect to the reference line of the PCB, the part arrangement processing section 132 calculates the angle $\alpha$ by the following manner (steps S44 and S45). The part arrangement processing section 132 creates the following first through fourth imaginary lines connecting the centers of the footprints at the four corners extracted in step S41 as illustrated in FIG. 14B (step S44):

a first imaginary line L1 that connects the center of the footprint including the minimum position C of the X direction to the center of the footprint including the minimum position D of the Y direction;

a second imaginary line L2 that connects the center of the footprint including the minimum position C of the X direction to the center of the footprint including the maximum position B of the Y direction;

a third imaginary line L3 that connects the center of the footprint including the maximum position A of the X direction to the center of the footprint including the minimum position D of the Y direction; and a fourth imaginary line L4 that connects the center of the footprint including the maximum position A of the X direction to the center of the footprint including the maximum position B of the Y direction.

The part arrangement processing section 132 compares the first through fourth imaginary lines L1 through L4 with the horizontal reference line (X axis) and the vertical reference line (Y axis), and calculates the angle α that the set of footprints forms with respect to either reference line (step S45). Here, the example of FIG. 14B assumes that the angle α is formed between the Y axis and the second imaginary line L2.

After that, as illustrated in FIG. 14C, the part arrangement processing section 132 rotates the set of footprints by the angle α calculated in step S45 in a predetermined direction, so that a set of imaginary footprints is formed (step S46). At that time, the center of rotation of the set of footprints may be, for example, the center of the rectangle defined by four imaginary lines L1 through L4, the origin of the X and Y axes predetermined for the board model, or an arbitrary point. In the example of FIG. 14C, the direction of the rotation (i.e., the predetermined direction) is a counterclockwise direction.

Then, as illustrated in FIG. 14D, the part arrangement processing section 132 determines the position of the part model and automatically arranges the part model onto the set of imaginary footprints (the set of footprints after being rotated) created in step S46 through the above procedure described with reference to FIGS. 4 through 12 (step S47). After arranging the part model, the part arrangement processing section 132 rotates the part model arranged on the set of imaginary footprints, together with the set of imaginary footprints, by the angle α in the reverse direction of the predetermined direction, and then mounts and arranges the part model onto the board model as illustrated in FIG. 14E (step S48). The center of rotation in the reverse direction is the same as the center of rotation used in step S46.

Finally, the part arrangement processing section 132 compares the footprints of the PCB with the terminals of the electronic parts, confirms the footprints accommodates the respective corresponding terminals (step S49), and terminates the procedure. If the footprints do not accommodate the respective corresponding terminals, the part arrangement processing section 132 notifies the designer of an error representing the result of the confirmation via the monitor 17 or the like.

Even if a set of footprints onto which the part model is to be mounted forms a predetermined angle with respect to a reference line of the PCB, the above processing makes it possible to accurately determine the position of the part model and automatically arrange the part model with respect to the set of footprints.

Figure 15:
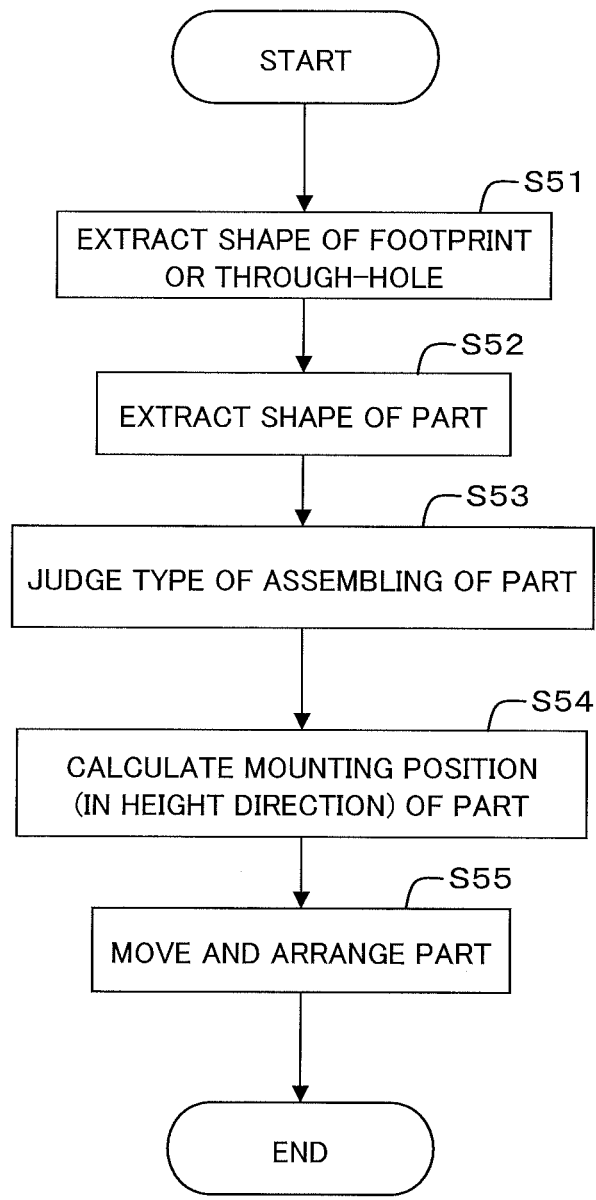
FIG. 15 is a flow diagram illustrating a succession of procedural steps of assembling a part model (adjusting a position of the height direction)
Figure 16A:
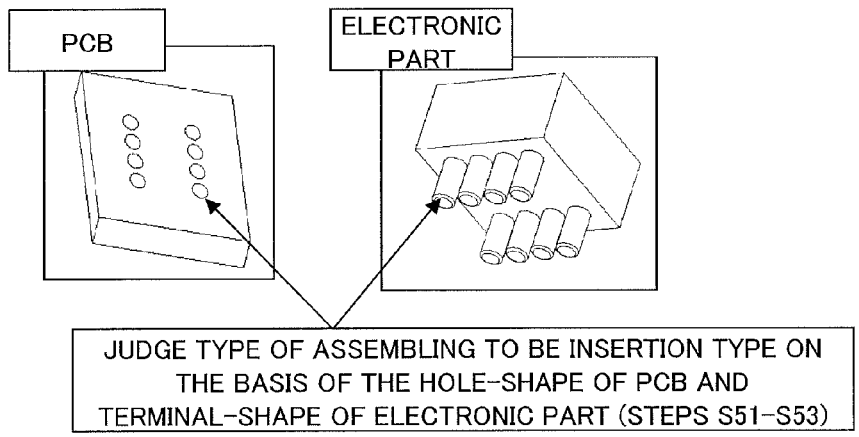
FIGS. 16A through 16C are diagram illustrating processing of assembling a part model (adjusting a position of the height direction).
Figure 16B:
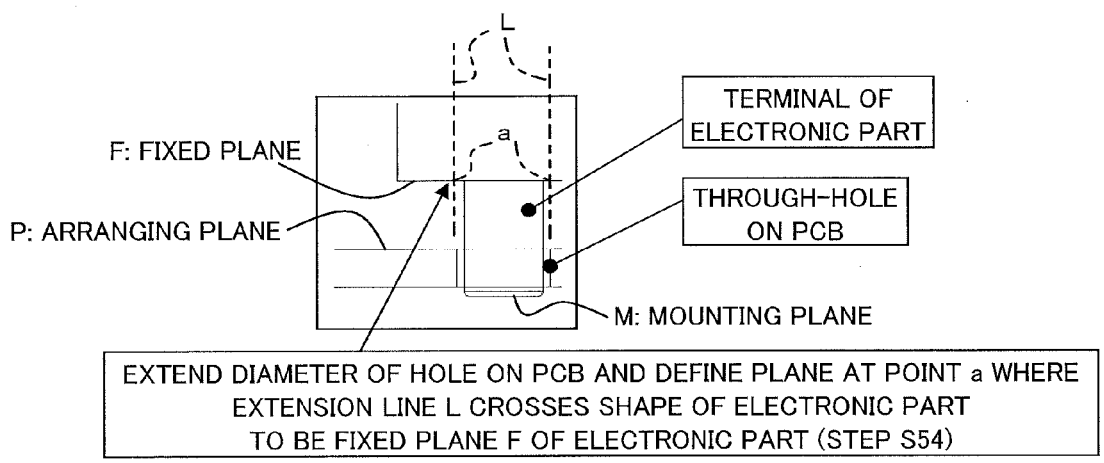
Figure 16C:
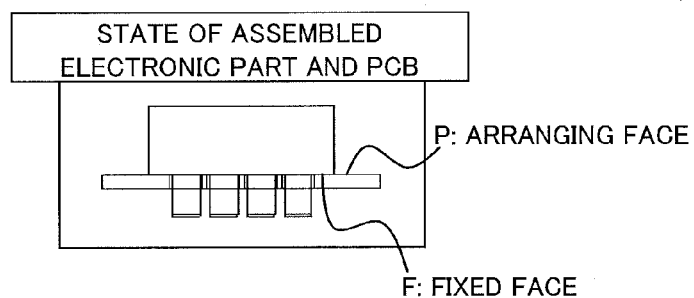

(2-5) Assembling the Part Model:

Next, description will now be made in relation to processing of assembling the part model (adjusting the position of the height direction through the procedure (steps S51-S55) of flow diagram FIG. 15 with reference to FIGS. 16A through 16C. FIGS. 16A through 16C describe processing of assembling the part model (adjusting the position of the height direction) when the assembling type is an insertion type.

After arranging the part model on the board model in the above manner, the part arrangement processing section 132 carries out the following assembling so that the position of the height direction (i.e., Z direction) of the part model is adjusted with respect to the board model.

First, the part arrangement processing section 132 extracts information of the shapes of the footprints or the through-holes from the board data (step S51) and further extracts information of the shapes of the terminals (pins) of the part data of the electronic part that is to be assembled (step S52). On the basis of the information of the shapes extracted in steps S51 and S52, the part arrangement processing section 132 judges the type of assembling of the assembled model consisting of the board model and the part model (step S53).

Here, the type of assembling is classified into two types of: a surface mount type that solders terminals of an electronic part to the surface pattern (footprints) of a PCB; and an insertion type that solders terminals of an electronic part after the terminals are inserted into terminal holes (through-holes) of a PCB. In step S53, the part arrangement processing section 132 judges, on the basis of information included in the board data, whether the PCB and the electronic part to be assembled is a surface mount type or an insertion type.

The part arrangement processing section 132 refers to the information of the shapes extracted in step S51 and, if judging that the through-holes (in the hole shapes) are formed on the PCB, obtains the diameters of the through-holes and the thickness of the PCB from the same information of the shapes. The part arrangement processing section 132 then refers to the information of the shapes extracted in step S52, and if, as illustrated in FIG. 16A, the electronic part has protrusions (terminals) that have diameters and heights fitting the obtained diameters and the obtained thickness on the mounting face extracted through the procedure of FIG. 4, the part arrangement processing section 132 judges that the type of assembling is an insertion type (step S53).

If the type of assembling is judged to be an insertion type, the part arrangement processing section 132 creates straight line L along the inner circumference face of a through hole and extending the depth direction of the hole under a state of the tip of a terminal being in a through-hole or a state of the tip face of the terminal being flush with the arranging face P of the PCB as illustrated in FIG. 16B. The tip face of a terminal corresponds to the mounting face M of the electronic device to be assembled extracted through the procedure of FIG. 4. The depth direction of a through-hole along the inner circumference of the through-hole corresponds to a direction perpendicular to the arranging face P, that is, the direction of assembling and mounting of the electronic part and the height direction. The part arrangement processing section 132 defines a plane being disposed at the intersection a of the straight line L and the shape of the electronic part and being parallel to the mounting face M to be a fixed face F (step S54). After that, as illustrated in FIG. 16C, the part arrangement processing section 132 moves and arranges the electronic part on the PCB such that the defined fixed plane F is flush with the arranging face P of the PCB (step S55). If the mounting face of the electronic part is extracted by the process of steps S24 through S26 of FIG. 5, the mounting face extracted through the procedure of FIG. 5 can be used as the fixed plane F.

The part arrangement processing section 132 refers to information of the shapes extracted in step S51 and, if recognizing the presence of footprint formed on the PCB, judges that the type of assembling is a surface mount type (step S53). If the type of assembling is judged to be a surface mount type, the part arrangement processing section 132 arranges the electronic part onto the PCB such that the mounting face of the electronic part to be assembled which face is extracted through the procedure of FIG. 4 coincides with the arranging face (footprint face) of the PCB to mount the electronic part (steps S54 and S55).

Figure 13:
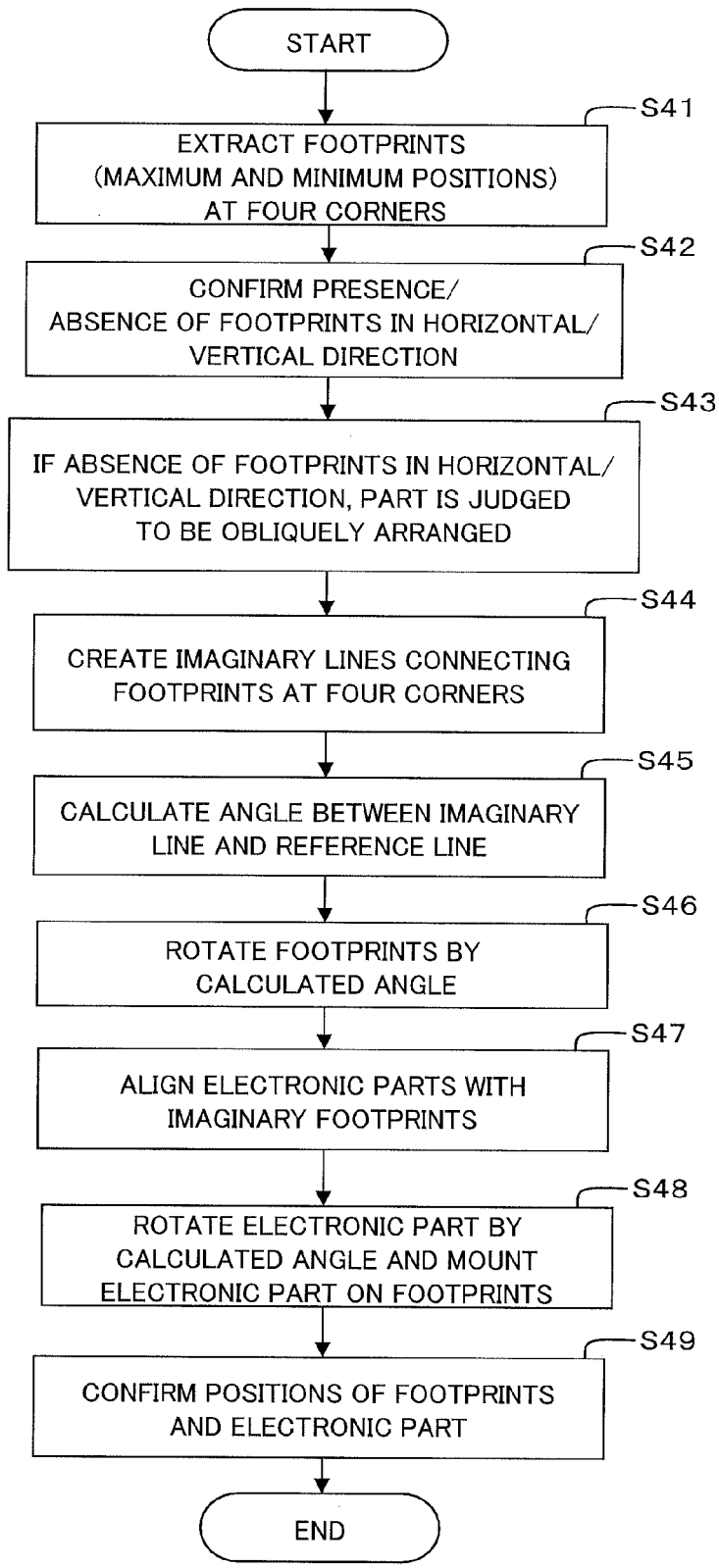
FIG. 13 is a flow diagram illustrating processing of arranging a part model on a board model when a set of footprints or through-holes is oblique to a reference line of the board model.

If the shape of soldering material to join a footprint and a terminal of an electronic part in the surface mount type, the part arrangement processing section 132 consider the thickness (position in the Z direction) of the soldering into determination of the arrangement position of the electronic part through the procedure of FIG. 8 or 13. Specifically, the part arrangement processing section 132 sets the soldering material to be a shape having a desired thickness between a terminal of the electronic part and a footprint.

The part arrangement processing section 132 judges the type of assembling of the assembled model in the above manner based on the board data and the part data. On the basis of the judged type of assembling and the mounting face recognized by the recognizing section 131, the part model is placed onto the board model. Thereby, the position of the height direction of a part model is adjusted and the part model is automatically and accurately arranged on the board model, so that the data of the assembling model can be created.

(3) Effects of the Design Aiding Device:

According to the design aiding device 1, after the 3D CAD data of the electronic part disclosed in the market in designing the PCB, the above procedure can unit the PCB CAD system 2 and the mechanical CAD system 3 independently of the manner of creating of the 3D CAD data of the electronic part. Thereby, the mounting position of the electronic part to the footprints or through-holes and the mounting position of the electronic part and another electronic part can be verified, so that the number of steps of designing mechanical devices including the PCB can be short and efficient, improving the quality of the products.

In particular, in the design aiding device 1, the recognizing section 131 automatically extracts the mounting face of the part model onto the board model from the outermost planes. The part arrangement processing section 132 determines the mounting direction of the part model and adjusts the arranging position of the part model and automatically arranges the part model on the board mode with high accuracy. Even if a set of footprints, onto which the part model is to be mounted, forms an angle with respect to the reference line of the PCB, the part arrangement processing section 132 accurately determines the position of the part model with respect to the set of the footprints and arranges the part model to the footprints with high accuracy. The part arrangement processing section 132 judges the type of assembling, assembles the part model and the board model according to the judged type of assembling, and adjusts the position of the height direction of the part model, so that the part model is automatically arranged on the board mode with high accuracy.

Thereby, the design aiding device 1 can unite the board data and the part data respectively created by the different two CAD systems 2 and 3, so that the position of the 3D model of the electronic part created by the mechanical CAD system 3 is automatically and accurately determined on the board model created by the PCB CAD system 2 and the 3D model is mounted onto the board model. Accordingly, the part model can be automatically arranged onto the board model with high accuracy, eliminating disadvantages of human judging mistake; increasing manpower; complexity of confirmation; and increasing steps of the confirmation.

(4) Others:

A preferred embodiment of the present invention is described as the above, but the present invention should by no means be limited to the above embodiment. Various changes and modifications can be suggested without departing from the gist of the present invention.

The above embodiment described the above assumes a part model having a symmetric pin arrangement in the left-right direction as illustrated in FIGS. 6A-7B, 9A-11C, and 16A-16C, and a part model having an asymmetric pin arrangement in the left-right direction as illustrated in FIG. 12. However, part models to be assembled by the design aiding device of the present invention should by no means be limited to these part model (e.g., the number of pins and a state of arrangement of the pins) of the embodiment. The design aiding device 1 ensures any part model the same effects as the first embodiment.

Part or the entire function of the recognizing section 131 and the part arrangement processing section 132 is realized by a computer (including CPU, information processor, various terminals) executing a predetermined application program (design aiding program).

The program is provided in the form of being stored in a non-transitory computer-readable recording medium such as flexible disk, CD (e.g., CD-ROM, CD-R, and CD-RW), a DVD (e.g. DVD-ROM, DVD-RAM, DVD-R, DVD-RW, DVD+R, and DVD+RW), and Blu-ray disk. The computer reads the program from the recording medium and sends the program to an internal or external memory to store for use.

Here, a computer is a concept of a combination of hardware and an OS and means hardware which operates under control of the OS. Otherwise, if an application program operates hardware not requiring an OS, the hardware itself corresponds to the computer. Hardware includes at least a microprocessor such as a CPU and means to read a computer program recorded in a recording medium. The design aiding program includes a program code that causes the above computer to realize the functions of the recognizing section 131 and the part arrangement processing section 132. Alternatively, part of the function may be realized by the OS, not by application program.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. A design aiding device, comprising:
   a first storing section that stores board data created for a board that is to be designed;
   a second storing section that stored part data created for a part to be designed and arranged on the board; and
   a processor that creates assembled model data, representing an assembled model that assumes arrangement of the part on the board, based on the board data and the part data stored in the first storing section and the second storing section, respectively, said processor including
      a recognizing section that recognizes a mounting face of a part model defined by the part data, the mounting face being mounted on a board model defined by the board data; and
      an arrangement processing section that creates the assembled model data by arranging the part model on the board model based on the mounting face recognized by the recognizing section which
         determines a first reference plane including a face of the part model having a maximum surface area and a second reference plane and a third reference plane which are perpendicular to the first reference plane and which are perpendicular to each other;
         sets six planes which are each parallel to one of the first through the third reference planes and which contact one with each of six outermost planes of the part model;

obtains shapes of the outermost planes on the six planes; and recognizes one of the six outermost planes as the mounting face on the basis of the shapes of the six outermost planes and information about an arranging face of the board model to arrange the part model, the information being included in the board data.

2. The design aiding device according to claim 1, wherein the recognizing section recognizes one of the six outermost planes as the mounting face on the basis of the number of closed shapes and the total surface area of the closed shapes on each of the six outermost planes and on the basis of the number of footprints or through-holes and the total surface area of the footprints or the through-holes on the arranging face of the board model, the number of the footprints or the through-holes and the total surface area of the footprints or the through-holes being obtained from the board data.

3. The design aiding device according to claim 2, wherein the recognizing section recognizes, as the mounting face, one outermost plane having the closed shapes as many as the footprints or the through-holes and having a ratio of the total surface area of the closed shapes to the total surface area of the footprints or the through-holes within a predetermined range, among the six outermost planes.

4. The design aiding device according to claim 3, wherein the recognizing section:

judges, if one of the six outermost planes has the closed shapes as many as the footprints or the through-holes while the ratio of the total surface area of the closed shapes to the total surface area of the footprints or the through-holes is equal to a predetermined value or less, an assembling type of the assembled model to be an insertion type which arranges the part model on the board model by inserting a terminal of the mounting face of the part model into a through-hole on the board model;

translates an extracted plane parallel to the one outermost surface inside the part model;

obtains a shape of the extracted plane at a point where the extracted plane comes into contact with the body of the part model; and judges, if a ratio of a total surface area of closed shapes on the extracted plane to the total surface area of the through-holes is within a predetermined range, the extracted plane to be the mounting face.

5. The design aiding device according to claim 1, wherein the arrangement processing section:

judges an assembling type of the assembled model on the basis of the board data and the part data; and arranges the part model on the board model on the basis of the judged assembling type and the mounting face recognized by the recognizing section.

6. The design aiding device according to claim 5, wherein the arrangement processing section:

defines, if the assembling type is judged to be an insertion type which arranges the part model on the board model by inserting a terminal disposed at the mounting face of the part model into a through-hole on the board model, a plane parallel to the mounting face at a point where a straight line along inner circumference of the through-hole in a depth direction of the through hole crosses the part model, as a fixed plane; and arranges the part model on the board model such that the fixed plane is flush with the arranging face of the board model to mount the part model.

7. The design aiding device according to claim 5, wherein the arrangement processing section arranges, if the assembling type is judged to be a surface mount type which arranges the part model on the board model by mounting a terminal disposed at the mounting face of the part model on a footprint of the board model, the part model on the board model such that the mounting face of the part model is flush with the arranging face of the board model to mount the part model.

8. A design aiding device, comprising:

a first storing section that stores board data created for a board that is to be designed;

a second storing section that stored part data created for a part to be designed and arranged on the board; and a processor that creates assembled model data, representing an assembled model that assumes arrangement of the part on the board, on the basis of the board data and the part data stored in the first storing section and the second storing section, respectively, said processor including a recognizing section that recognizes a mounting face of a part model defined by the part data, the mounting face being mounted on a board model defined by the board data; and an arrangement processing section that creates the assembled model data by arranging the part model on the board model on the basis of the mounting face recognized by the recognizing section, wherein the arrangement processing section:

determines a direction of mounting the part model on the board model on the basis of a first state of arrangement of a plurality of terminals corresponding to closed shape on the mounting face and a second state of arrangement of footprints or through-holes on an arranging face of the board model to mount the part model, the second state being obtained from the board data; and arranges the part model on the board model in the determined direction of mounting.

9. The design aiding device according to claim 8, wherein the arrangement processing section:

calculates a deviation amount of a center of a first terminal, which is one of the plurality of terminals on the mounting face of the part model, from a center of a footprint or through-hole onto which the first terminal is to be arranged under a state in which the part model is arranged on the board model such that a center of a second terminal, which is another one of the plurality of terminals on the mounting face, coincides with a center of a footprint or a through-hole onto which the second terminal is to be arranged; and adjusts a position of arranging the part model on the board model on the basis of the calculated deviation amount.

10. The design aiding device according to claim 9, wherein the first terminal and the second terminal have a longest distance among the plurality of terminals.

11. The design aiding device according to claim 8, wherein the arrangement processing section:

calculates a first deviation amount of a center of a first terminal, which is one of the plurality of terminals on the mounting face, of the part model, from a center of a footprint or through-hole onto which the first terminal is to be arranged under a state in which the part model is arranged on the board model such that a center of a second terminal, which is another one of the plurality of terminals on the mounting face, coincides with a center of a footprint or a through-hole onto which the second terminal is to be arranged;

calculates a second deviation amount of the center of the second terminal from the center of the footprint or through-hole onto which the second terminal is to be arranged under a state in which the part model is arranged on the board model such that the center of the first terminal coincides with the center of the footprint or the through-hole onto which the first terminal is to be arranged; and adjusts a position of arranging the part model on the board model on the basis of the first calculated deviation amount and the calculated second deviation amount.

12. The design aiding device according to claim 8, wherein the arrangement processing section:
   obtains, from the board data, information of a plurality of the footprints or the through-holes of the board model onto which the part model is to be mounted;
   calculates an angle between the plurality of footprints or through-holes and a reference line on the board model on the basis of the information obtained;
   rotates the plurality of footprints or through-holes in a predetermined direction by the calculated angle;
   arranges the part model onto the plurality of footprints or through-holes after being rotated; and
   rotates the part model arranged onto the plurality of footprints or through-holes after being rotated in a reverse direction of the predetermined direction by the calculated angle together with the plurality of footprints or through-holes, and arranges the part model on the board model.

13. The design aiding device according to claim 12, wherein the arrangement processing section:
   judges whether the plurality of footprints or through-holes are oblique to the reference line of the board model on the basis of the information of the plurality of footprints or through-holes; and
   calculates, if the plurality of footprints or through-holes are judged to be oblique to the reference line of the board model, the angle.

14. A non-transitory computer-readable recording medium in which a design aiding program that instructs a processor to create data of an assembled model, in which a part to be designed is arranged on a board to be arranged, on the basis of board data created for the board to be designed and part data created for the part to be designed is stored, wherein the design aiding program instructing the processor to function as:
   a recognizing section that recognizes a mounting face of a part model defined by the part data, the mounting face being mounted on a board model defined by the board data; and
   an arrangement processing section that creates the data of the assembled model by arranging the part model on the board model on the basis of the mounting face recognized by the recognizing section which
      determines a first reference plane including a face of the part model having a maximum surface area and a second reference plane and a third reference plane which are perpendicular to the first reference plane and which are perpendicular to each other;
      sets six planes which are each parallel to one of the first through the third reference planes and which contact one with each of six outermost planes of the part model;
      obtains shapes of the outermost planes on the six planes; and
      recognizes one of the six outermost planes as the mounting face on the basis of the shapes of the six outermost planes and information about an arranging face of the board model to arrange the part model, the information being included in the board data.

15. A non-transitory computer-readable recording medium in which a design aiding program that instructs a processor to create data of an assembled model, in which a part to be designed is arranged on a board to be arranged, on the basis of board data created for the board to be designed and part data created for the part to be designed is stored, wherein the design aiding program instructing the processor to function as:
   a recognizing section that recognizes a mounting face of a part model defined by the part data, the mounting face being mounted on a board model defined by the board data; and
   an arrangement processing section that creates the data of the assembled model by arranging the part model on the board model on the basis of the mounting face recognized by the recognizing section, wherein the arrangement processing section:
      determines a direction of mounting the part model on the board model on the basis of a first state of arrangement of a plurality of terminals corresponding to closed shape on the mounting face and a second state of arrangement of footprints or through-holes on an arranging face of the board model to mount the part model, the second state being obtained from the board data; and
      arranges the part model on the board model in the determined direction of mounting.

* * * * *

UNITED STATES PATENT AND TRADEMARK OFFICE
CERTIFICATE OF CORRECTION

| | | |
|---|---|---|
| PATENT NO. | : 8,522,191 B2 | Page 1 of 1 |
| APPLICATION NO. | : 13/211457 | |
| DATED | : August 27, 2013 | |
| INVENTOR(S) | : Youji Uchikura et al. | |

It is certified that error appears in the above-identified patent and that said Letters Patent is hereby corrected as shown below:

On the Title Page, Item (54) and in the Specification, Col. 1, Line 1, Title, Before "AIDING" insert -- DESIGN --.

Signed and Sealed this
Third Day of December, 2013

Margaret A. Focarino
*Commissioner for Patents of the United States Patent and Trademark Office*